US012651708B2

(12) United States Patent
Fisher et al.

(10) Patent No.: US 12,651,708 B2
(45) Date of Patent: Jun. 9, 2026

(54) STACKED INTEGRATED PASSIVE DEVICE

(71) Applicant: MACOM Technology Solutions Holdings, Inc., Lowell, MA (US)

(72) Inventors: Jeremy Fisher, Raleigh, NC (US); Marvin Marbell, Cary, NC (US); Haedong Jang, San Jose, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 748 days.

(21) Appl. No.: 18/078,779

(22) Filed: Dec. 9, 2022

(65) Prior Publication Data

US 2024/0194413 A1     Jun. 13, 2024

(51) Int. Cl.

| | |
|---|---|
| *H01G 4/40* | (2006.01) |
| *H01F 27/28* | (2006.01) |
| *H01F 27/29* | (2006.01) |
| *H01G 4/012* | (2006.01) |
| *H01G 4/228* | (2006.01) |
| *H01G 4/33* | (2006.01) |
| *H01G 4/38* | (2006.01) |
| *H10D 1/20* | (2025.01) |
| *H10D 1/68* | (2025.01) |
| *H10W 90/00* | (2026.01) |

(52) U.S. Cl.
CPC ........... *H01G 4/40* (2013.01); *H01F 27/2804* (2013.01); *H01F 27/292* (2013.01); *H01G 4/228* (2013.01); *H01G 4/33* (2013.01); *H01G 4/38* (2013.01); *H10D 1/20* (2025.01); *H10D 1/692* (2025.01); *H10W 90/00* (2026.01); *H01G 4/012* (2013.01); *H10W 90/754* (2026.01); *H10W 90/759* (2026.01)

(58) Field of Classification Search
None
See application file for complete search history.

(56) References Cited

U.S. PATENT DOCUMENTS

| | | | | |
|---|---|---|---|---|
| 7,605,458 | B1 * | 10/2009 | Rahman .............. | H01L 25/0657 |
| | | | | 257/774 |
| 7,648,911 | B2 * | 1/2010 | Pagaila ................... | H01L 25/50 |
| | | | | 257/621 |
| 7,772,081 | B2 * | 8/2010 | Lin ........................ | H10D 86/85 |
| | | | | 257/E29.001 |
| 8,853,819 | B2 * | 10/2014 | Chen ...................... | H10D 86/85 |
| | | | | 257/E21.004 |
| 2008/0001285 | A1 * | 1/2008 | Yang ....................... | H01L 23/50 |
| | | | | 257/E23.079 |

(Continued)

*Primary Examiner* — Nishath Yasmeen
(74) *Attorney, Agent, or Firm* — Sage Patent Group

(57) ABSTRACT

A device according to some embodiments includes a first IPD die including a first SiC substrate. The first IPD die has a first surface and a second surface on the first SiC substrate opposite the first surface and includes a first contact and at least one first metal portion on the respective surfaces of the first SiC substrate. The device further includes a second IPD die including a second SiC substrate. The second IPD die has a third surface and a fourth surface on the second SiC substrate opposite the third surface and includes a second contact and at least one second metal portion on the respective surfaces of the second SiC substrate. The device further includes an electrical interconnection structure between one of the first and second surfaces of the first IPD die and one of the third and fourth surfaces of the second IPD die.

30 Claims, 12 Drawing Sheets

(56) References Cited

U.S. PATENT DOCUMENTS

| | | | |
|---|---|---|---|
| 2013/0037936 A1* | 2/2013 | Choi | H01L 21/565 |
| | | | 257/737 |
| 2014/0217546 A1* | 8/2014 | Yen | H01L 23/5227 |
| | | | 438/381 |
| 2016/0099301 A1* | 4/2016 | Yen | H01L 23/5227 |
| | | | 257/531 |
| 2018/0323765 A1* | 11/2018 | Armanious | H03H 1/00 |
| 2022/0189919 A1* | 6/2022 | Jeng | H01L 24/19 |

* cited by examiner

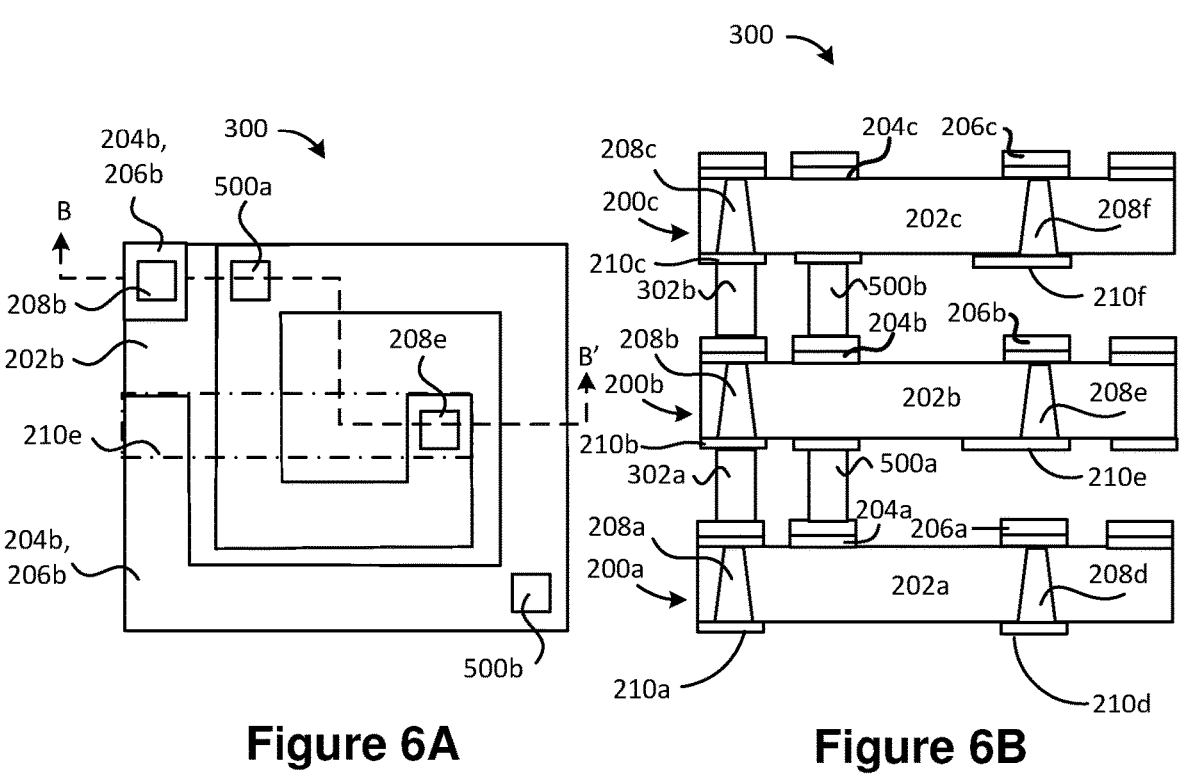
Figure 6A          Figure 6B

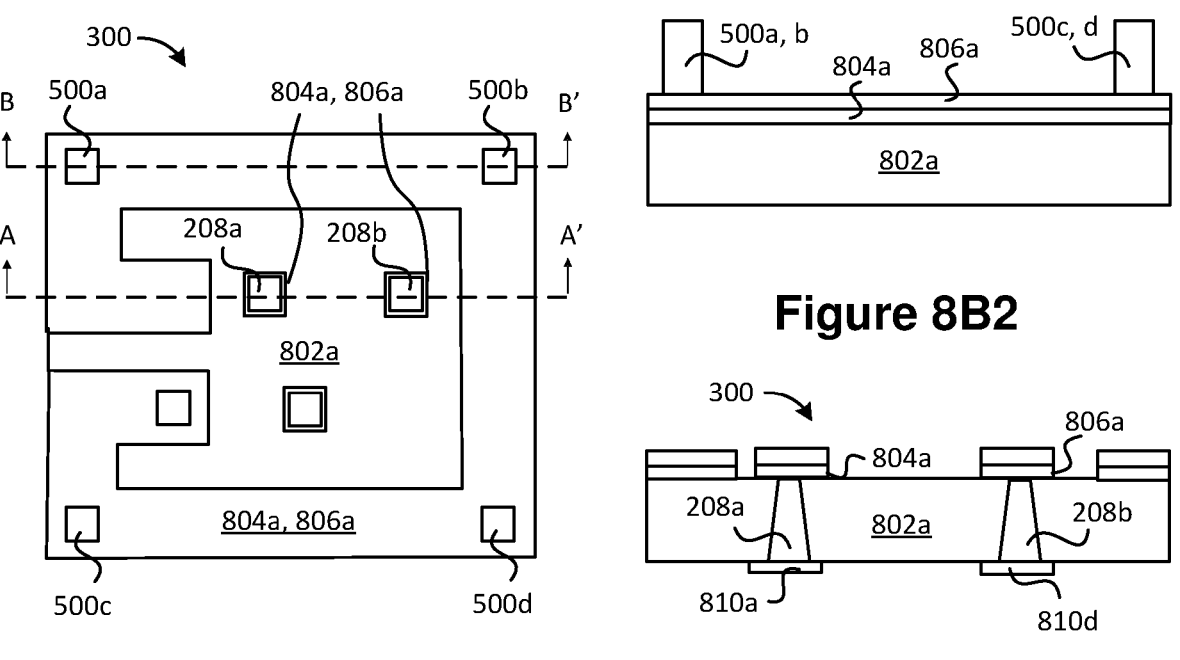
Figure 8A
Figure 8B2
Figure 8B1
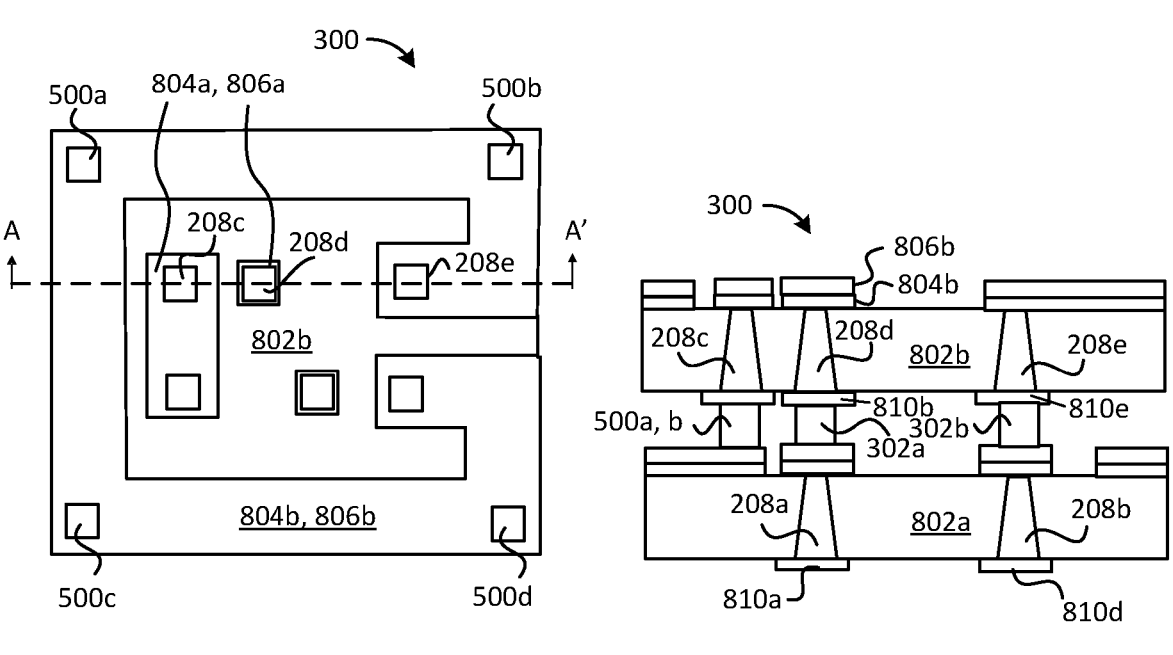
Figure 8C
Figure 8D

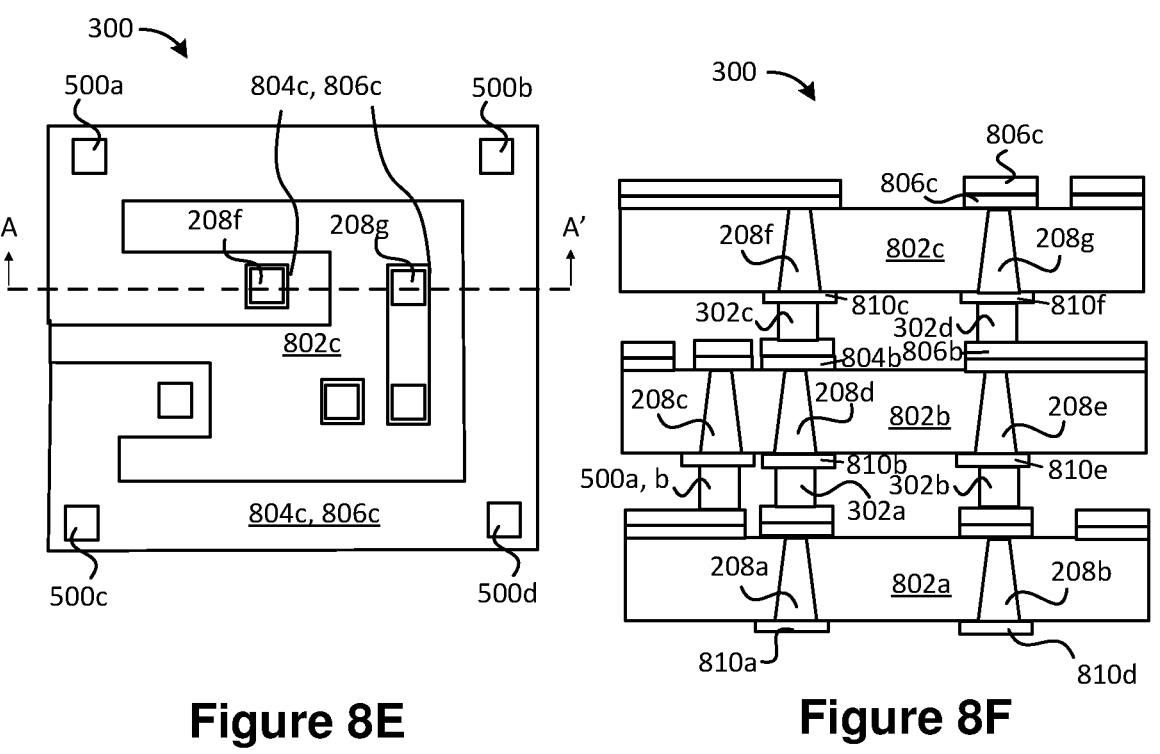
Figure 8E
Figure 8F
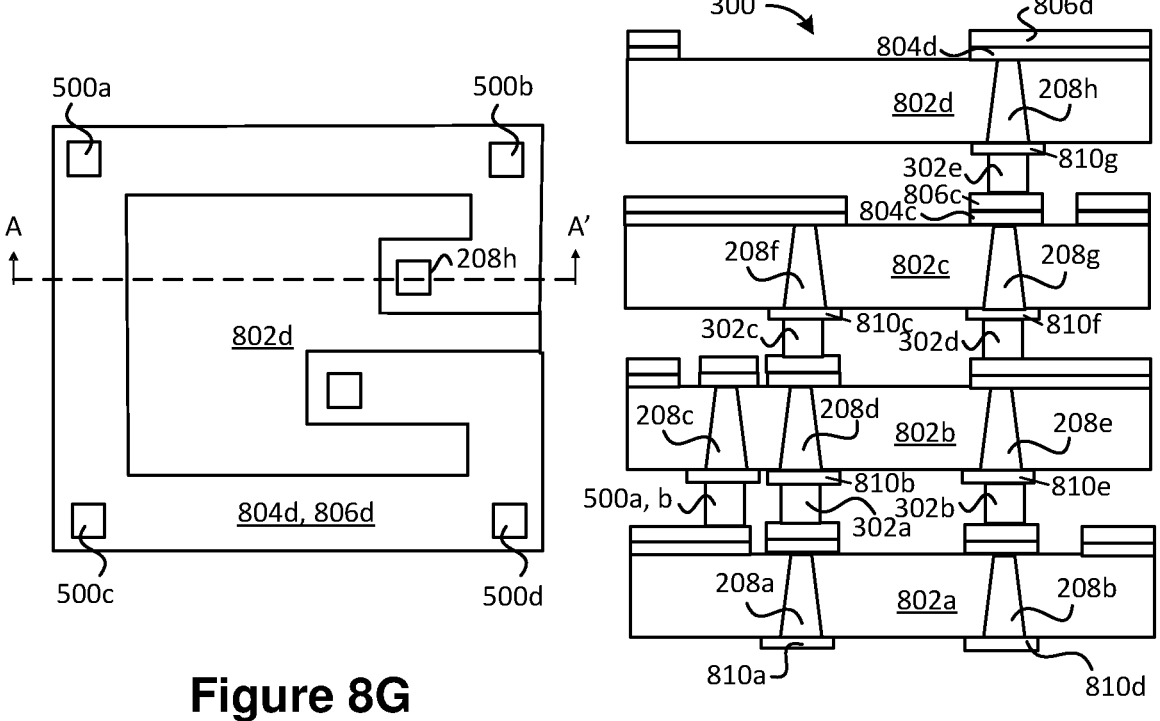
Figure 8G
Figure 8H

STACKED INTEGRATED PASSIVE DEVICE

FIELD

The disclosure is directed to stacked integrated passive devices (IPDs).

BACKGROUND

RF power amplifiers are used in a variety of applications such as base stations for wireless communication systems, etc. The signals amplified by the RF power amplifiers often include signals that have a modulated carrier having frequencies in the megahertz (MHz) to gigahertz (GHz) range. The baseband signal that modulates the carrier is typically at a relatively lower frequency and, depending on the application, can be up to 300 MHz or higher. Many RF power amplifier designs utilize semiconductor switching devices as amplification devices. Examples of these switching devices include power transistor devices, such as MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally-diffused metal-oxide semiconductor) transistors, etc.

RF amplifiers are typically formed as semiconductor integrated circuit chips. Most RF amplifiers are implemented in silicon or using wide bandgap semiconductor materials (i.e., having a band-gap greater than 1.40 eV), such as silicon carbide ("SiC") and Group III nitride materials. As used herein, the term "Group Ill nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

RF amplifiers often include matching circuits, such as impedance matching circuits, that are designed to improve the impedance match between the active transistor die (e.g., including MOSFETs, HEMTs, LDMOS, etc.) and transmission lines connected thereto for RF signals at the fundamental operating frequency, and harmonic termination circuits that are designed to at least partly terminate harmonic products that may be generated during device operation, such as second and third order harmonic products. The termination of the harmonic products also influences generation of intermodulation distortion products.

The RF amplifier transistor die(s) as well as the impedance matching and harmonic termination circuits may be enclosed in a device package. A die or chip may refer to a small block of semiconducting material or other substrate on which electronic circuit elements are fabricated. Integrated circuit packaging may refer to encapsulating one or more dies in a supporting case or package that protects the dies from physical damage and/or corrosion, and supports the electrical contacts for connection to external circuits. The input and output impedance matching circuits in an integrated circuit device package typically include LC networks that provide at least a portion of an impedance matching circuit that is configured to match the impedance of the active transistor die to a fixed value. Electrical leads may extend from the package to electrically connect the RF amplifier to external circuit elements such as input and output RF transmission lines and bias voltage sources.

Many functional blocks such as impedance matching circuits, harmonic filters, couplers, baluns, and power combiners/dividers can be realized by IPDs. IPDs include passive electrical components and are generally fabricated using standard wafer fabrication technologies such as thin film and photolithography processing. IPDs can be designed as flip chip mountable or wire bondable components. The substrates for IPDs usually are thin film substrates like silicon, alumina, or glass, which may allow for ease in manufacturing and packaging with active transistor dies.

Some conventional methods include a planar implementation of an IPD(s). For example, typically, an IPD is implemented on a wafer substrate, diced, and used as a single component (e.g., an RF power component). A component value of such an IPD die may be limited for such a planar implementation.

SUMMARY

A device according to some embodiments includes a first IPD die including a first silicon carbide (SiC) substrate. The first IPD die has a first surface on the first SiC substrate and a second surface on the first SiC substrate opposite the first surface and includes a first contact on the first surface and at least one first metal portion on the second surface of the first SiC substrate. The device further includes a second IPD die including a second SiC substrate. The second IPD die has a third surface on the second SiC substrate and a fourth surface on the second SiC substrate opposite the third surface and includes a second contact on the third surface and at least one second metal portion on the fourth surface of the second SiC substrate. The device further includes at least one electrical interconnection structure between one of the first and second surfaces of the first IPD die and one of the third and fourth surfaces of the second IPD die.

The device may further include at least one mechanical support structure between one of the first and second surfaces of the first IPD die and one of the third and fourth surfaces of the second IPD die.

The at least one electrical interconnection structure may include at least one of (i) a metal material comprising copper, gold, or silver tin; and (ii) a conductive epoxy.

The first surface of the first IPD die may face the fourth surface of the second IPD die and the at least one electrical interconnection structure may be connected to the first contact of the first IPD die and the at least one second metal portion on the fourth surface of the second IPD die.

The first surface of the first IPD die may face the third surface of the second IPD die and the at least one electrical interconnection structure may be connected to the first contact of the first IPD die and the second contact on the third surface of the second IPD die.

The device may further include a first conductive via structure in the first SiC substrate. The at least one first metal portion on the second surface of the first SiC substrate may be electrically connected to the first contact on the first surface of the first IPD die by the first conductive via structure. The device may further include a second conductive via structure in the second SiC substrate. The at least one second metal portion on the fourth surface of the second SiC substrate may be electrically connected to the second contact on the third surface of the second IPD die by the second conductive via structure.

The at least one first metal portion on the second surface of the first SiC substrate may be patterned to form at least one of a pad and a routing trace for the electrical connection of the first IDP die to the second IPD die.

The at least one second metal portion on the fourth surface of the second SiC substrate may be patterned to form at least one of a pad and a routing trace for the electrical connection of the first IDP die to the second IPD die.

The device may further include a dielectric material between the first IDP die and the second IPD die.

The first IPD die may include a first metal-insulator-metal, MIM, capacitor on the first SiC substrate and the second IPD die comprises a second MIM capacitor on the second SiC substrate, and the at least one electrical interconnection structure may include (i) a first electrical interconnection structure between a first metal on the first surface of the first MIM capacitor to a second metal on the third surface of the second MIM capacitor and (ii) a second electrical interconnection structure between a second metal on the first surface of the first MIM capacitor to a first metal on the third surface of the second MIM capacitor.

The first IPD die may include a first MIM capacitor on the first SiC substrate and the second IPD die comprises a second MIM capacitor on the second SiC substrate, and the at least one electrical interconnection structure may include (i) a first electrical interconnection structure between a first metal on the first surface of the first MIM capacitor to a first metal portion of the at least one second metal portion on the fourth surface of the second IPD die and (ii) a second electrical interconnection structure between a second metal on the first surface of the first MIM capacitor and a second metal portion of the at least one second metal portion on the fourth surface of the second IPD die.

The first IPD die may include a first spiral inductor and the second IPD die may include a second spiral inductor, and the at least one electrical interconnection structure may include a first electrical interconnection structure and a second electrical interconnection structure between the first and second spiral inductors connected in parallel.

The first IPD die may include a first spiral inductor and the second IPD die may include a second spiral inductor, and the at least one electrical interconnection structure may be between the first and second spiral inductors connected in series.

The first IPD die may include a one to one coupler that includes a first metal trace on the first surface of the first IPD die and a second metal trace on the first surface of the second IPD die, and the at least one electrical interconnection structure may be between one of the first and second surfaces of the first IPD die and one of the third and fourth surfaces of the second IPD die.

The device may include a resonant structure that includes the first IPD die including a MIM capacitor and the second IPD die including an inductor, and the at least one electrical interconnection structure is between one of the first and second surfaces of the first IPD die and one of the third and fourth surfaces of the second IPD die.

An RF component package according to some embodiments includes an encapsulated device including a plurality of IPD dies in a stacked structure. The device includes a first IPD die including a first SiC substrate. The first IPD die has a first surface on the first SiC substrate and a second surface on the first SiC substrate opposite the first surface and includes a first contact on the first surface and at least one first metal portion on the second surface of the first SiC substrate. The device further includes a second IPD die including a second SiC substrate. The second IPD die has a third surface on the second SiC substrate and a fourth surface on the second SiC substrate opposite the third surface and includes a second contact on the third surface and at least one second metal portion on the fourth surface of the second SiC substrate. The device further includes at least one electrical interconnection structure between one of the first and second surfaces of the first IPD die and one of the third and fourth surfaces of the second IPD die.

The RF component package may further include at least one mechanical support structure between one of the first and second surfaces of the first IPD die and one of the third and fourth surfaces of the second IPD die.

The at least one electrical interconnection structure may include at least one of (i) a metal material comprising copper, gold, or silver tin; and (ii) a conductive epoxy.

The first surface of the first IPD die may face the fourth surface of the second IPD die and the at least one electrical interconnection structure may be connected to the first contact of the first IPD die and the at least one second metal portion on the fourth surface of the second IPD die.

The first surface of the first IPD die may face the third surface of the second IPD die and the at least one electrical interconnection structure may be connected to the first contact of the first IPD die and the second contact on the third surface of the second IPD die.

The RF component package may further include a first conductive via structure in the first SiC substrate. The at least one first metal portion on the second surface of the first SiC substrate may be electrically connected to the first contact on the first surface of the first IPD die by the first conductive via structure. The device may further include a second conductive via structure in the second SiC substrate. The at least one second metal portion on the fourth surface of the second SiC substrate may be electrically connected to the second contact on the third surface of the second IPD die by the second conductive via structure.

The at least one first metal portion on the second surface of the first SiC substrate may be patterned to form at least one of a pad and a routing trace for the electrical connection of the first IDP die to the second IPD die.

The at least one second metal portion on the fourth surface of the second SiC substrate may be patterned to form at least one of a pad and a routing trace for the electrical connection of the first IDP die to the second IPD die.

The RF component package may further include a dielectric material between the first IDP die and the second IPD die.

The first IPD die may include a first metal-insulator-metal, MIM, capacitor on the first SiC substrate and the second IPD die comprises a second MIM capacitor on the second SiC substrate, and the at least one electrical interconnection structure may include (i) a first electrical interconnection structure between a first metal on the first surface of the first MIM capacitor to a second metal on the third surface of the second MIM capacitor and (ii) a second electrical interconnection structure between a second metal on the first surface of the first MIM capacitor to a first metal on the third surface of the second MIM capacitor.

The first IPD die may include a first MIM capacitor on the first SiC substrate and the second IPD die comprises a second MIM capacitor on the second SiC substrate, and the at least one electrical interconnection structure may include (i) a first electrical interconnection structure between a first metal on the first surface of the first MIM capacitor to a first metal portion of the at least one second metal portion on the fourth surface of the second IPD die and (ii) a second electrical interconnection structure between a second metal on the first surface of the first MIM capacitor and a second metal portion of the at least one second metal portion on the fourth surface of the second IPD die.

The first IPD die may include a first spiral inductor and the second IPD die may include a second spiral inductor, and the at least one electrical interconnection structure may include a first electrical interconnection structure and a second electrical interconnection structure between the first and second spiral inductors connected in parallel.

The first IPD die may include a first spiral inductor and the second IPD die may include a second spiral inductor, and the at least one electrical interconnection structure may be between the first and second spiral inductors connected in series.

The first IPD die may include a one to one coupler that includes a first metal trace on the first surface of the first IPD die and a second metal trace on the first surface of the second IPD die, and the at least one electrical interconnection structure may be between one of the first and second surfaces of the first IPD die and one of the third and fourth surfaces of the second IPD die.

The RF component package may include a resonant structure that includes the first IPD die including a MIM capacitor and the second IPD die including an inductor, and the at least one electrical interconnection structure is between one of the first and second surfaces of the first IPD die and one of the third and fourth surfaces of the second IPD die.

Additional features, advantages, and aspects of the disclosure may be set forth or apparent from consideration of the following detailed description, drawings, and claims. Moreover, it is to be understood that both the foregoing summary of the disclosure and the following detailed description includes examples and are intended to provide further explanation without limiting the scope of the disclosure as claimed.

BRIEF DESCRIPTION OF THE DRAWINGS

The accompanying drawings, which are included to provide a further understanding of the disclosure, are incorporated in, and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings:

FIG. 6A illustrates a top view of a middle IPD die in another example device including three stacked IPD dies connected with electrical interconnection structures in accordance with some embodiments of the present disclosure.

FIG. 6B is a cross-section view of the device of FIG. 6A across line B-B'.

FIG. 7B1 is a cross-section view of the bottom IPD die of FIG. 7A across line A-A'.

FIG. 7B2 is a cross-section view of the bottom IPD die of FIG. 7A across line B-B'.

FIG. 8A illustrates a top view of a bottom IPD die in another example device including four stacked IPD dies connected with electrical interconnection structures in accordance with some embodiments of the present disclosure.

FIG. 8B1 is a cross-section view of the bottom IPD die of the device of FIG. 8A across line A-A'.

FIG. 8B2 is a cross-section view of the bottom IPD die of the device of FIG. 8A across line B-B'.

FIG. 8C illustrates a top view of the second bottom IPD die of the device of FIG. 8A.

FIG. 8D is a cross-section view of the device of FIG. 8C across line A-A'.

FIG. 8E illustrates a top view of the third bottom IPD die of the device of FIG. 8A.

FIG. 8F is a cross-section view of the device of FIG. 8E across line A-A'.

FIG. 8G illustrates a top view of the top IPD die of the device of FIG. 8A.

FIG. 8H is a cross-section view of the device of FIG. 8G across line A-A'.

DETAILED DESCRIPTION OF THE DISCLOSURE

Figures 1, 2A, 2B:
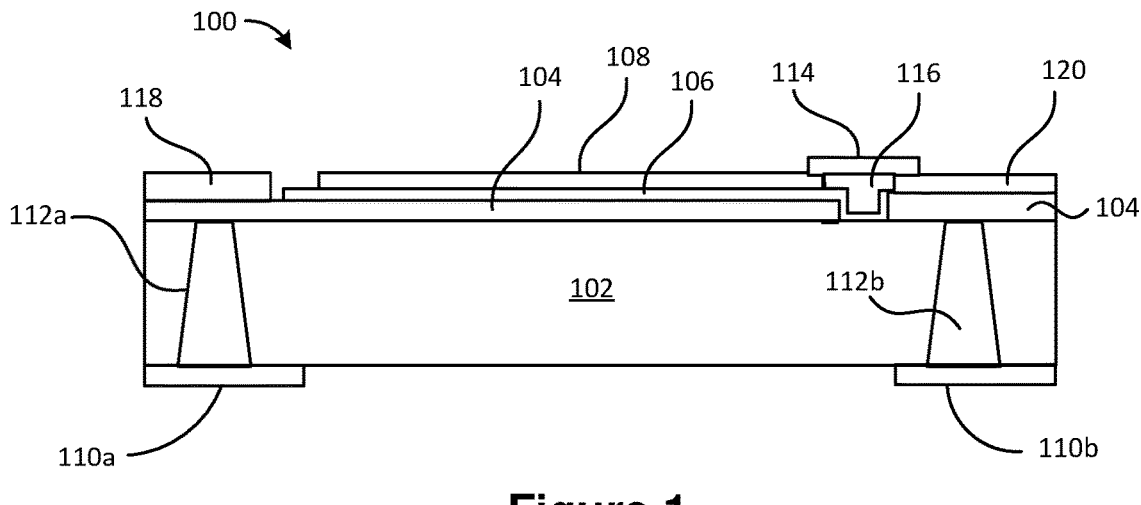
FIG. 1 is a cross-section view illustrating a conventional metal-insulator-metal capacitor IPD implemented on a SiC wafer substrate.
FIG. 2A is a top view illustrating a conventional spiral inductor implemented on a SiC wafer substrate.
FIG. 2B is a cross-section view of the spiral inductor of FIG. 2A.

Embodiments of the inventive concepts are explained more fully with reference to the non-limiting aspects and examples that are described and/or illustrated in the accompanying drawings and detailed in the following description. It should be noted that the features illustrated in the drawings are not necessarily drawn to scale, and features of some embodiments may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a metal, a contact, or a substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a metal, a contact, or a substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below", "above", "upper", "lower", "horizontal", "vertical", "top", "bottom", or "middle" may be used herein to describe a relationship of one element, die, layer, or region to another element, die, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Some embodiments of the present disclosure may arise from limitations on a component value for an IPD. For example, some conventional planar implementations of IPDs may have a limited component value density per IPD footprint. Moreover, some conventional configurations of IPDs may include multiple IPDs arranged in a linear, planar configuration, where not only may each IPD have a limited component value density per IPD, but the footprint of the linearly arranged multiple IPDs may be large (e.g., due to the planar configuration and wire bonds between IPDs in the planar configuration). A large footprint may increase manufacturing costs and limit available space for IPDs and other components due to the planar configuration.

It may be desirable to vertically stack IPDs, which may form a device of a larger value or larger capacity for the same footprint of a single IPD. Additionally, the footprint of stacked IPDs may be reduced in comparison to a planar, linear configuration of multiple IPDs due to the vertical configuration of the stacked IPDs. However, difficulties may arise in vertically stacking IPDs that respectively include a SiC substrate due to a potential need for a through SiC via structure. For example, conductive via structures (e.g., conductive vias through the SiC substrate) may need to be included in the respective SiC-based IPDs in order to provide an electrical connection between a top surface of an IPD and a bottom surface of the IPD, which may increase manufacturing difficulties and costs.

In contrast to some conventional planar configurations of IPDs, embodiments of the present disclosure provide a device that includes multiple IPD dies that include respective SIC substrates where the IPD dies are stacked on top of one another. As a consequence, multiple, stacked IPDs may form a device of a larger value or larger capacity compared to the same footprint of a single IPD die. A device that includes stacked IPD dies (e.g., IPDs including passive electronic components, such as capacitors, inductors, resistors, metal traces, etc., for example) may increase the device value density per given footprint and, thus, may overcome an available value limitation for a given IPD die or a planar, linearly arranged configuration of IPDs.

FIG. 1 is a cross-section view illustrating a conventional metal-insulator-metal (MIM) capacitor IPD die 100 that includes a SiC wafer substrate 102. The IPD die 100 may be, e.g., a typical RF power application MIM capacitor implemented on a SiC substrate. On the top of the substrate 102, there is a first metal 104 on top of the substrate 102; an insulator 106 (e.g., silicon nitride (SiN)) is on top of the first metal 104; and a second metal 108 is on top of the insulator 106, forming a MIM capacitor. The top contacts 118, 120 and bottom contacts 110a, 110b can be connected to other components through metal 104 or metal 108 and connected to a pad or to the back-side of the substrate 102 or a bottom metal 110a, 110b through a conductive via 112a, 112b. IPD die 100 further includes cross-over 114 between second metal 108 and contact 120, and cross-over underfill 116. Contacts are also referred to herein as pads, electrodes, or metals.

In some embodiments, both top contact 118 and first metal 104 of the capacitor are connected to bottom metal 110a, 110b through conductive vias 112a, 112b. The back-side metal 110a, 110b can be patterned to form a pad or a routing trace for electrical connection of one IPD die to another IPD die, if needed. The capacitance (C) of the capacitor is decided by the area (A) of the MIM capacitor divided by the thickness (d) of the dielectric material 106 multiplied by the dielectric constant of the material (E) resulting in C=E×A/d. Therefore, for the given E and d of the dielectric material, the capacitance C is decided by A, and the maximum C is limited by the maximum A. As a consequence of vertically stacking IPD dies in embodiments of the present disclosure, the capacitance C may be increased by stacking an IPD die by N and, thus, N times C of the single component may be obtained.

FIG. 2A is a top view illustrating a conventional spiral inductor 200 implemented on a SiC substrate 202; and FIG. 2B is a cross-section view of the spiral inductor 200 of FIG. 2A. The spiral inductor 200, in this example, includes a second metal 206 placed on a first metal 204 forming a thicker metal (e.g., for larger current handling). The spiral inductor 200 can be connected to other components through bond wires, for example. In this example, the ends of the spiral inductor 200 are connected to a bottom metal 210a, 210b through conductive vias 208a, 208b, respectively.

Some embodiments include a device that includes a first IPD die including a first silicon carbide (SiC) substrate. The first IPD die has a first surface on the first SiC substrate and a second surface on the first SiC substrate opposite the first surface and includes a first contact on the first surface and at least one first metal portion on the second surface of the first SiC substrate. The device further includes a second IPD die including a second SiC substrate. The second IPD die has a third surface on the second SiC substrate and a fourth surface on the second SiC substrate opposite the third surface and includes a second contact on the third surface and at least one second metal portion on the fourth surface of the second SiC substrate. The device further includes at least one electrical interconnection structure between one of the first and second surfaces of the first IPD die and one of the third and fourth surfaces of the second IPD die.

The device may further include at least one mechanical support structure between one of the first and second surfaces of the first IPD die and one of the third and fourth surfaces of the second IPD die.

The first surface of the first IPD die may face the fourth surface of the second IPD die and the at least one electrical interconnection structure may be connected to the first contact of the first IPD die and the at least one second metal portion on the fourth surface of the second IPD die.

The first surface of the first IPD die may face the third surface of the second IPD die and the at least one electrical interconnection structure may be connected to the first contact of the first IPD die and the second contact on the third surface of the second IPD die.

The device may further include a first conductive via structure in the first SiC substrate. The at least one first metal portion on the second surface of the first SiC substrate may be electrically connected to the first contact on the first surface of the first IPD die by the first conductive via structure. The device may further include a second conductive via structure in the second SiC substrate. The at least one second metal portion on the fourth surface of the second SiC substrate may be electrically connected to the second contact on the third surface of the second IPD die by the second conductive via structure.

Figure 3:
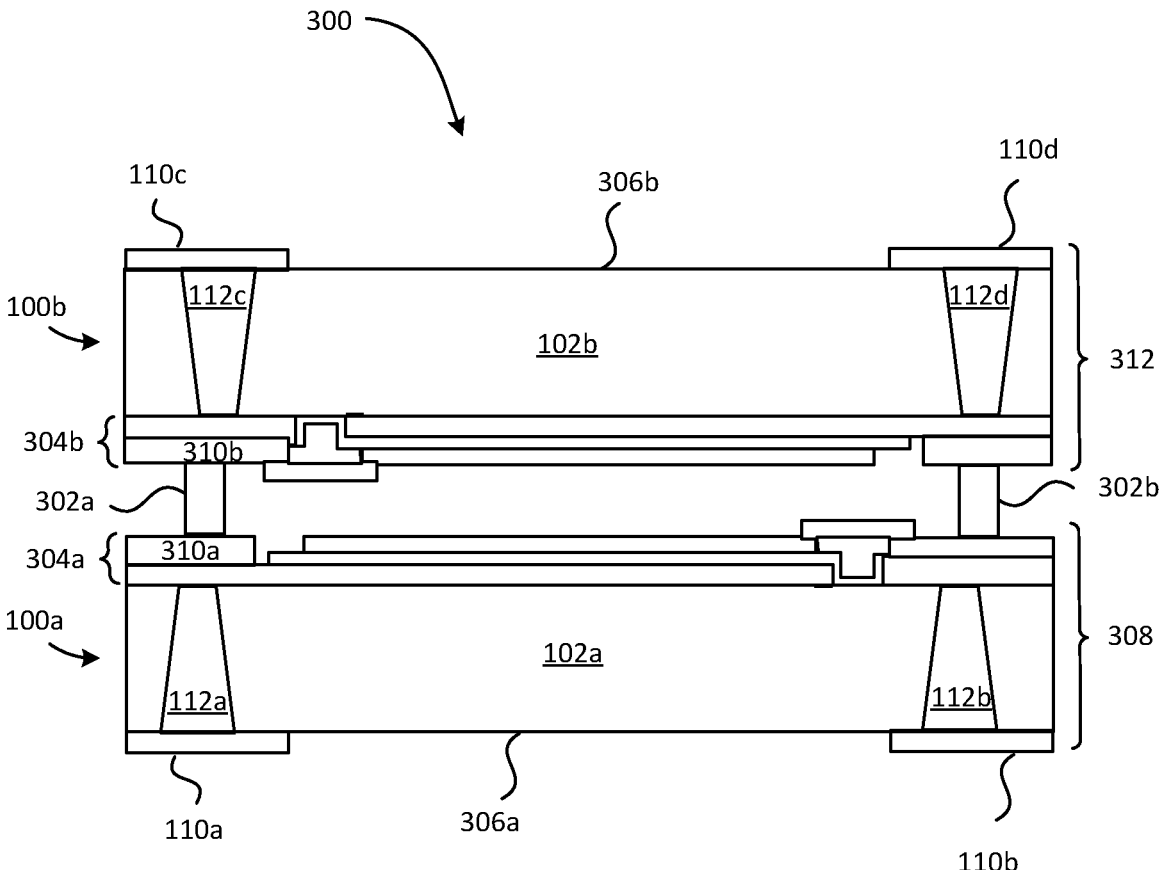
FIG. 3 is a cross-section view illustrating an example of a device including two stacked IPD dies connected with electrical interconnection structures in accordance with some embodiments of the present disclosure.

FIG. 3 is a cross-section view illustrating an example of a device 300 including two stacked IPD dies connected with electrical interconnection structures in accordance with some embodiments of the present disclosure. In this example, the device 300 includes two stacked MIM capacitor IPD dies 100a, 100b. The top IPD die 100b is connected upside-down (e.g., a flip-chip IPD) to the bottom IPD die 100a through two electrical interconnection structures 302a, 302b.

Electrical interconnection structures (e.g., electrical interconnection structure 302a, 302b respectively) can be a metal pillar and/or a metal bump (e.g., a solder bump). For example, a metal pillar and/or metal bump that includes one or more of gold (Au), silver tin (AgSn), copper (Cu), etc. Alternatively or additionally, electrical interconnection structures 302a, 302b respectively can be a conductive epoxy material. Moreover, a device can include at least one or more electrical interconnection structures. As discussed further herein, a device can also include one or more mechanical interconnection support structures, without electrical connection. Interconnection structures can be a solder bump or intermediate structures comprised of individual electrical, thermal and/or mechanical supporting/alignment elements. Additionally, an interconnection structure can comprise one or more integral interconnection structures with electrical, mechanical and/or thermal elements.

In some embodiments, the one or more electrical interconnection structures includes at least one of (i) a metal material comprising Cu, Ag, or AgSn; and (ii) a conductive epoxy.

Figure 4:
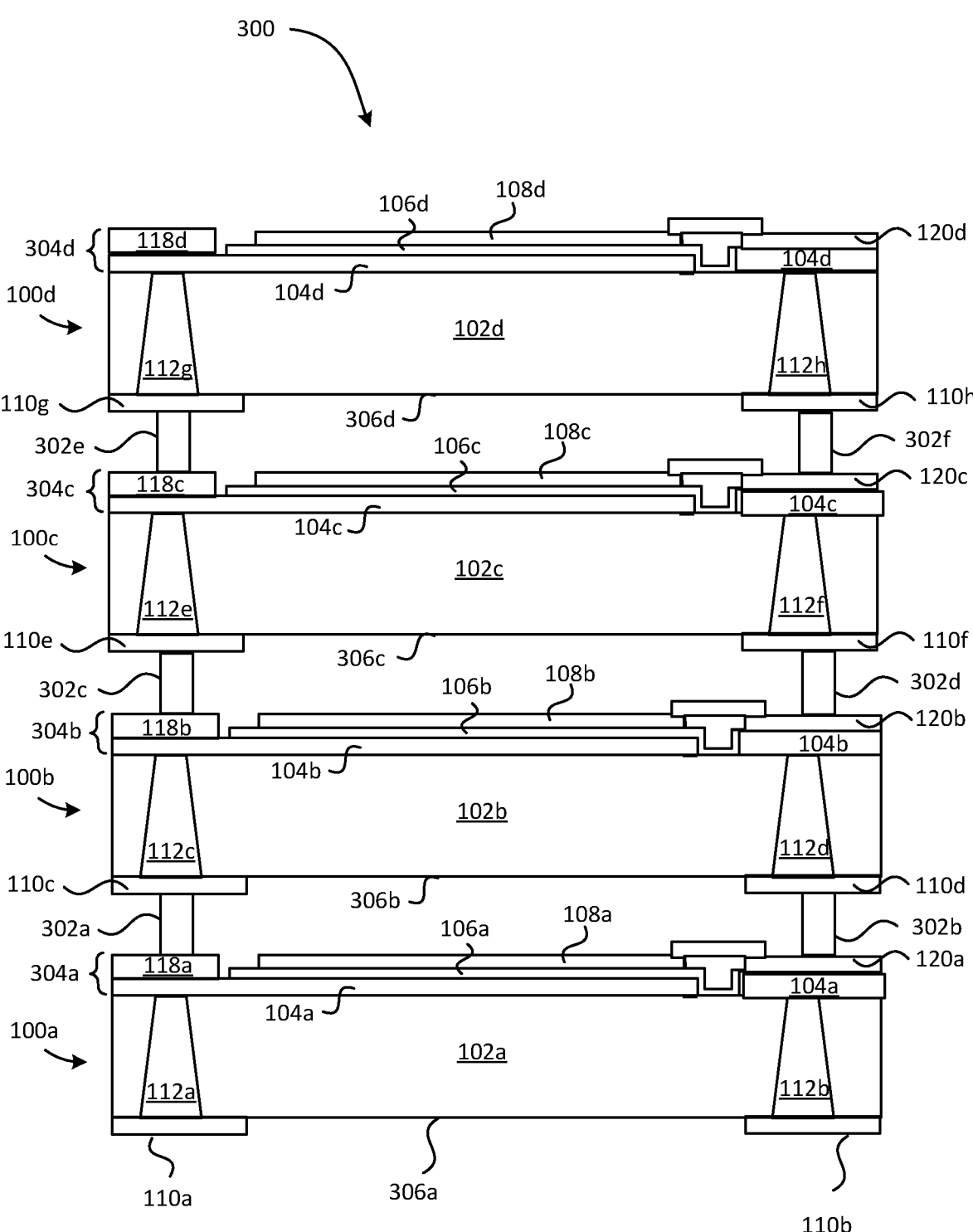
FIG. 4 is a cross-section view illustrating an example of a device including four stacked IPD dies connected with electrical interconnection structures in accordance with some embodiments of the present disclosure.

FIG. 4 is a cross-section view illustrating another example of a device 300 including four stacked IPD dies connected with electrical interconnection structures in accordance with some embodiments of the present disclosure. In this example, the device 300 includes four stacked MIM capacitor IPD dies 100a, 100b, 100c, 100d.

The top surface 304a of the first IPD die 100a includes first metal 104a, insulator 106a, second metal 108a, and top contacts 118a, 120a. The top surface 304a of the first IPD die 100a is connected to a bottom surface 306b of a second IPD die 100b through two electrical interconnection structures 302a, 302b connected between top contact 118a and bottom metal portion 110c and between top contact 120a and bottom metal portion 110d, respectively. Additionally, the top contacts 118a, 120a and bottom metal portions 110a, 110b are respectively connected through conductive vias 112a, 112b.

The top surface 304b of the second IPD die 100b includes first metal 104b, insulator 106b, second metal 108b, and top contacts 118b, 120b. The top surface 304b of the second IPD die 100b is connected to a bottom surface 306c of a third IPD die 100c through two electrical interconnection structures 302c, 302d connected between top contact 118b and bottom metal portion 110e and between top contact 120b and bottom metal portion 110f, respectively. Additionally, the top contacts 118b, 120b and bottom metal portions 110c, 110d are respectively connected through conductive vias 112c, 112d.

The top surface 304c of the third IPD die 100c includes first metal 104c, insulator 106c, second metal 108c, and top contacts 118c, 120c. The top surface 304c of the third IPD die 100c is connected to a bottom surface 306d of a fourth IPD die 100d through two electrical interconnection structures 302e, 302f connected between top contact 118c and bottom metal portion 110g and between top contact 120c and bottom metal portion 110h. Additionally, the top contacts 118c, 120c and bottom metal portions 110e, 110f are respectively connected through conductive vias 112e, 112f.

The top surface 304d of the fourth IPD die 100d includes first metal 104d, insulator 106d, second metal 108d, and top contacts 118d, 120d. The top contacts 118d, 120d and bottom metal portions 110g, 110h on bottom surface 306d of the fourth IPR die 100d are respectively connected through conductive vias 112g, 112h.

While certain embodiments herein are discussed in the context of two, three, or four stacked IPD dies, the present disclosure is not so limited. Rather, any number N of IPD die can be stacked using an electrical interconnection structure(s) and/or mechanical support structure(s) as discussed in example embodiments herein. In examples where the stacked IPD die include capacitors (e.g., MIM capacitors), as a consequence of the stacking, the device may have N times the capacitance of a single IPD that includes a capacitor and, thus, may achieve N times larger capacitance for the same foot-print of the single IPD die.

Moreover, while the examples herein of the device of the Figures shows respective IPD die connected through one or more electrical interconnection structures and, in some embodiments, mechanical support structures that form a resulting space between the top surface a the first IPD die and the top or bottom surface of a second IPD die, the present disclosure is not so limited. Rather, the electrical interconnection structure(s) and, in some embodiments, mechanical support structures may result in a smaller or larger resulting space than that illustrated in the Figures.

Some embodiments include a first IPD die that includes a first MIM capacitor on a first SiC substrate and a second IPD die that includes a second MIM capacitor on a second SiC substrate; and the at least one electrical interconnection structure. The electrical interconnection structure(s) can include (i) a first electrical interconnection structure between a first metal on the first surface of the first MIM capacitor to a second metal on the third surface of the second MIM capacitor and (ii) a second electrical interconnection structure between a second metal on the first surface of the first MIM capacitor to a first metal on the third surface of the second MIM capacitor.

Other embodiments include a first IPD die that includes a first MIM capacitor on a first SiC substrate and the second IPD die that includes a second MIM capacitor on the second SiC substrate; and the at least one electrical interconnection structure. The electrical interconnection structure(s) can include (i) a first electrical interconnection structure between a first metal on the first surface of the first MIM capacitor to a first metal portion of the at least one second metal portion on the fourth surface of the second IPD die and (ii) a second electrical interconnection structure between a second metal on the first surface of the first MIM capacitor and a second metal portion of the at least one second metal portion on the fourth surface of the second IPD die.

Figures 5A, 5B:
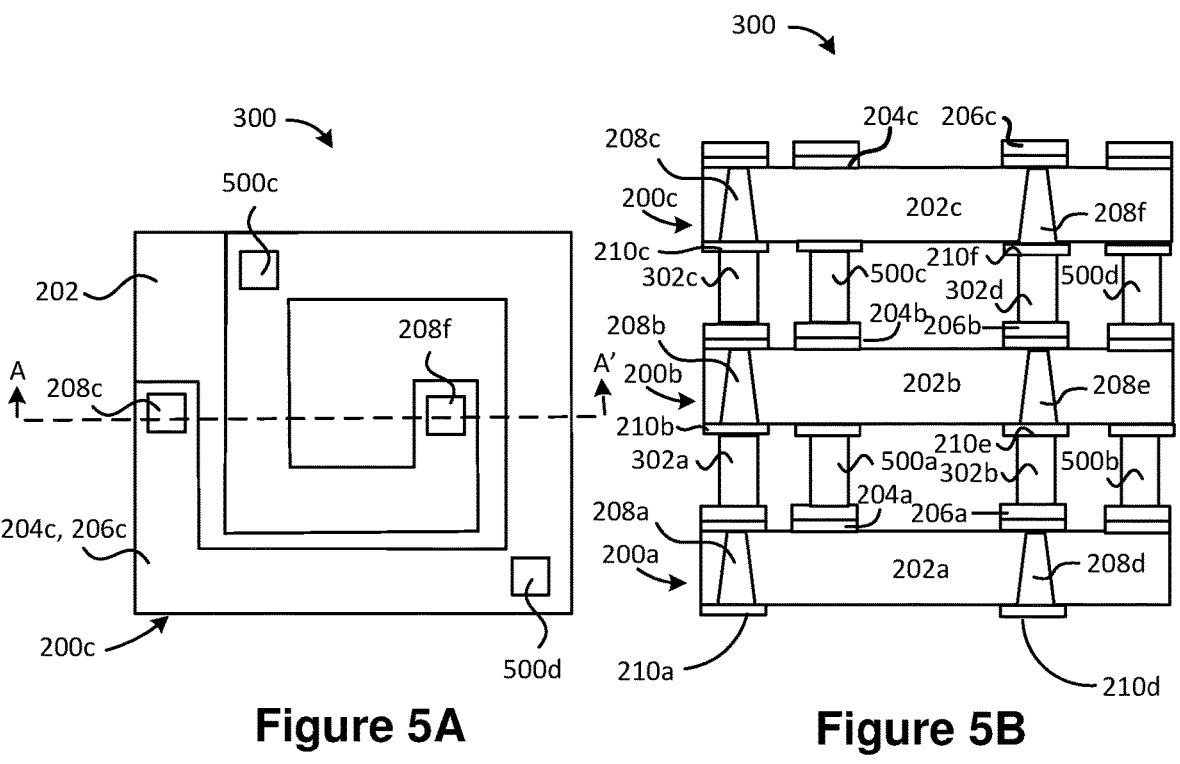
FIG. 5A is a top view illustrating an example device including three stacked IPD dies connected with electrical interconnection structures in accordance with some embodiments of the present disclosure.
FIG. 5B is a cross-section view of the device of FIG. 5A.

FIG. 5A is a top view illustrating another example device 300 including three stacked IPD dies connected with electrical interconnection structures in accordance with some embodiments of the present disclosure. FIG. 5B is a cross-section view of the device 300 of FIG. 5A through the line A-A'. In this example, the device 300 has three spiral inductors IPD dies 200a, 200b, 200c stacked and connected in parallel. As illustrated, the top of device 300 is shown in FIG. 5A and illustrates the top IDP die 200c that includes a spiral inductor on a SiC carbide substrate 202. As shown in FIGS. 5A and 5B, a second metal 206c is on a first metal 204c forming a thicker metal (e.g., for larger current handling). As shown in FIG. 5A, the ends of the spiral inductor of the top IPD die 200c are connected to first and second bottom metals 210c, 210f of the top IPD die 200c through conductive vias 208c, 208f respectively.

The middle IPD die 200b includes a spiral inductor having a second metal 206b on a first metal 204b forming a thicker metal. The top surface of the middle IPD die 200b includes a first contact/first metal 204b and a second contact/second metal 206b. The ends of the spiral inductor of the middle IPD die 200b are connected to first and second bottom metals 210b, 210e of the middle IPD die 200b through conductive vias 208b, 208e respectively. The top surface of the middle IPD die 200b is connected to a bottom surface of the top IPD die 200c through two electrical interconnection structures 302c, 302d connected between top contacts/metals 204b/206b of the middle IPD die 200b and bottom metal portions 210c, 210f of the top IPD die 200c. Additionally, in this example, two mechanical support structures 500c, 500d, without electrical connection, are between the top surface of the middle IPD die 200b and the bottom surface of the top IPD die 200c.

The bottom IPD die 200a includes a spiral inductor having a second metal 206a on a first metal 204a forming a thicker metal. The top surface of the bottom IPD die 200a includes a first contact/first metal 204a and a second contact/second metal 206a. The ends of the spiral inductor of the bottom IPD die 200a are connected to first and second bottom metals 210a, 210d of the bottom IPD die 200a through conductive vias 208a, 208d respectively. The top surface of the bottom IPD die 200a is connected to a bottom surface of the middle IPD die 200b through two electrical interconnection structures 302a, 302b connected between top contact/metal 204a/206a of the bottom IPD die 200a and bottom metal portions 210b, 210e of the middle IPD die 200b. Additionally, in this example, two mechanical supports 500a, 500b, without electrical connection, are between the top surface of the bottom IPD die 200a and the bottom surface of the middle IPD 200b.

With a parallel connection as illustrated in FIGS. 5A, 5B, for example, the inductance may be reduced by the number N of IPD die stacked (three, in this example) while increasing the current carrying capacity.

As previously discussed, some embodiments of the present disclosure include mechanical support structures (e.g., mechanical support structures) that do not have an electrical connection. The mechanical support structures can be a metal pillar and/or a metal bump (e.g., a solder bump). For example, a metal pillar and/or metal bump that includes one or more of Au, AgSn, Cu, etc. Alternatively or additionally, mechanical support structures can be a conductive epoxy material. Additionally, mechanical support structures can be intermediate structures comprised of individual thermal and/or mechanical supporting/alignment elements. Additionally, a mechanical support structure can comprise one or more integral interconnection structures with mechanical and/or thermal elements. Some devices including stacked IPDs do not include a mechanical support structure between IPD dies. For devices that that include a mechanical support structure, the quantity and position of the mechanical support structure between IPD dies depends, e.g., on the size and design of the device. For example, large IPD die areas may include one or more mechanical support structures.

In some embodiments, at least one mechanical support structure is between one of the first and second surfaces of a first IPD die and one of the third and fourth surfaces of the second IPD die.

Figures 6C, 6D, 6E:
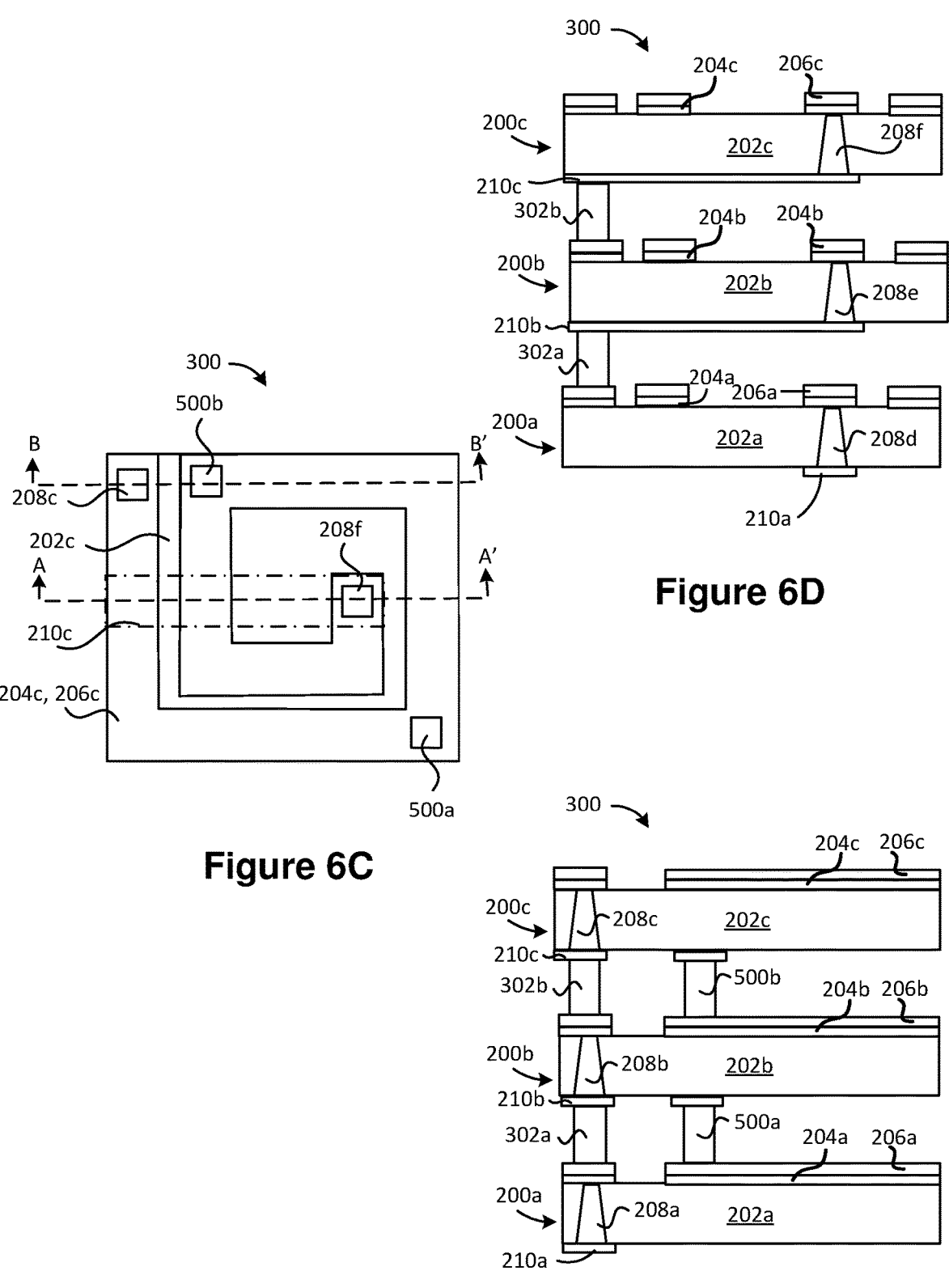
FIG. 6C illustrates a top view of the top IPD die of the device of FIG. 6A.
FIG. 6D is a cross-section view of the device of FIG. 6C across line A-A'.
FIG. 6E is a cross-section view of the device of FIG. 6C across line B-B'.

FIG. 6A illustrates a top view of a middle IPD die 200b in another example device including three stacked IPD dies 200a, 200b, 200c connected with electrical interconnection structures in accordance with some embodiments of the present disclosure. FIG. 6B is a cross-section view of the device of FIG. 6A across line B-B'. FIG. 6C illustrates a top view of the top IPD die 200c of the device of FIG. 6A. FIG.

6D is a cross-section view of the device of FIG. 6C across line A-A'. FIG. 6E is a cross-section view of the device of FIG. 6C across line B-B'. In this example, the device 300 has three spiral inductors IPD dies 200a, 200b, 200c stacked and connected in series.

As illustrated, a top view of the middle IPD die 200b is shown in FIG. 6A and includes a spiral inductor on a SiC carbide substrate 202b. As shown in FIGS. 6A and 6B, a second metal 206b is on a first metal 204b forming a thicker metal (e.g., for larger current handling). As shown in FIGS. 6A and 6B, an end of the spiral inductor of the middle IPD die 200b is connected to a first top contact/metals 204b, 206b of the middle IPD die 200b, and top contact/metals 204b, 206b is connected to bottom metal 210e of the middle IPD die 200b through conductive via 208e. A second top contact/metals 204b, 206b of the middle IPD die 200b is connected to bottom metal 210b of the middle IPD die 200b through conductive via 208b. The top surface of the middle IPD die 200b is connected to a bottom surface of the top IPD die 200c through electrical interconnection structure 302b connected between the second top contact/metal 204b, 206b and bottom metal portion 210c of the top IPD die 200c. Additionally, in this example, a mechanical support 500b, without electrical connection, is between the top surface of the middle IPD die 200b and the bottom surface of the top IPD die 200c.

The bottom IPD die 200a includes a spiral inductor having a second metal 206a on a first metal 204a forming a thicker metal. First and second bottom metals 210a, 210d of the bottom IPD die 200a are connected through conductive vias 208a, 208d, respectively, to first and second top contact/metals 204a, 206a, respectively, of the top surface of the bottom IPD die 200a. The top surface of the bottom IPD die 200a is connected to a bottom surface of the middle IPD die 200b through electrical interconnection structure 302a connected between first top contact/metal 204a, 206a and bottom metal portion 210b of the middle IPD die 200b. Additionally, in this example, a mechanical support 500a, without electrical connection, is between the top surface of the bottom IPD die 200a and the bottom surface of the middle IPD die 200b.

FIG. 6C illustrates a top view of the top IDP die 200c that includes a spiral inductor on a SiC carbide substrate 202c. As shown in FIG. 6C and the cross-section shown in FIG. 6D through the line A-A' of FIG. 6C, a second metal 206c is on a first metal 204c forming a thicker metal (e.g., for larger current handling). As shown in FIGS. 6C and 6D, an end of the spiral inductor of the top die 200c is connected to top contact/metals 204c, 206c of the top IPD die 200c, and top contact/metals 204c, 206c is connected to bottom metal 210c of the top IPD die 200c through conductive via 208f. The bottom metal 210c of the top IPD die 200c is connected to a top surface of the middle IPD die 200b through electrical interconnection structure 302b. As shown in FIG. 6C and the cross-section shown in FIG. 6E through the line B-B' in FIG. 6C, the other end of the spiral inductor of the top IPD die 200c is connected to top contact/metals 204c, 206c of the top IPD die 200c, and top contact/metals 204c, 206c is connected to bottom metal 210c of the top IPD die 200c through conductive via 208c. The bottom metal 210c of the top IPD die 200c is connected to a top surface of the middle IPD die 200b through electrical interconnection structure 302b. Mechanical support 500b, without electrical connection, is between the top surface of the middle IPD die 200b and the bottom surface of the top IPD die 200c.

With a series connection as illustrated in FIGS. 6A-6E, for example, the inductance may be increased by the number N of IPD die stacked (three, in this example). Moreover, in this example, the bottom metal 210 of the respective IPD dies may be patterned as a routing for connecting a respective conductive via to the other end of the inductor to be connected to another component to achieve a series connection of the components.

Some embodiments are directed to a device that includes a first IPD die that includes a first spiral inductor and a second IPD die that includes a second spiral inductor; and at least one electrical interconnection structure that includes a first electrical interconnection structure and a second electrical interconnection structure between the first and second spiral inductors connected in parallel.

Some embodiments are directed to a device that includes a first IPD die that includes a first spiral inductor and a second IPD die that includes a second spiral inductor; and at least one electrical interconnection structure between the first and second spiral inductors connected in series.

Figures 7A, 7C, 7D, 7E:
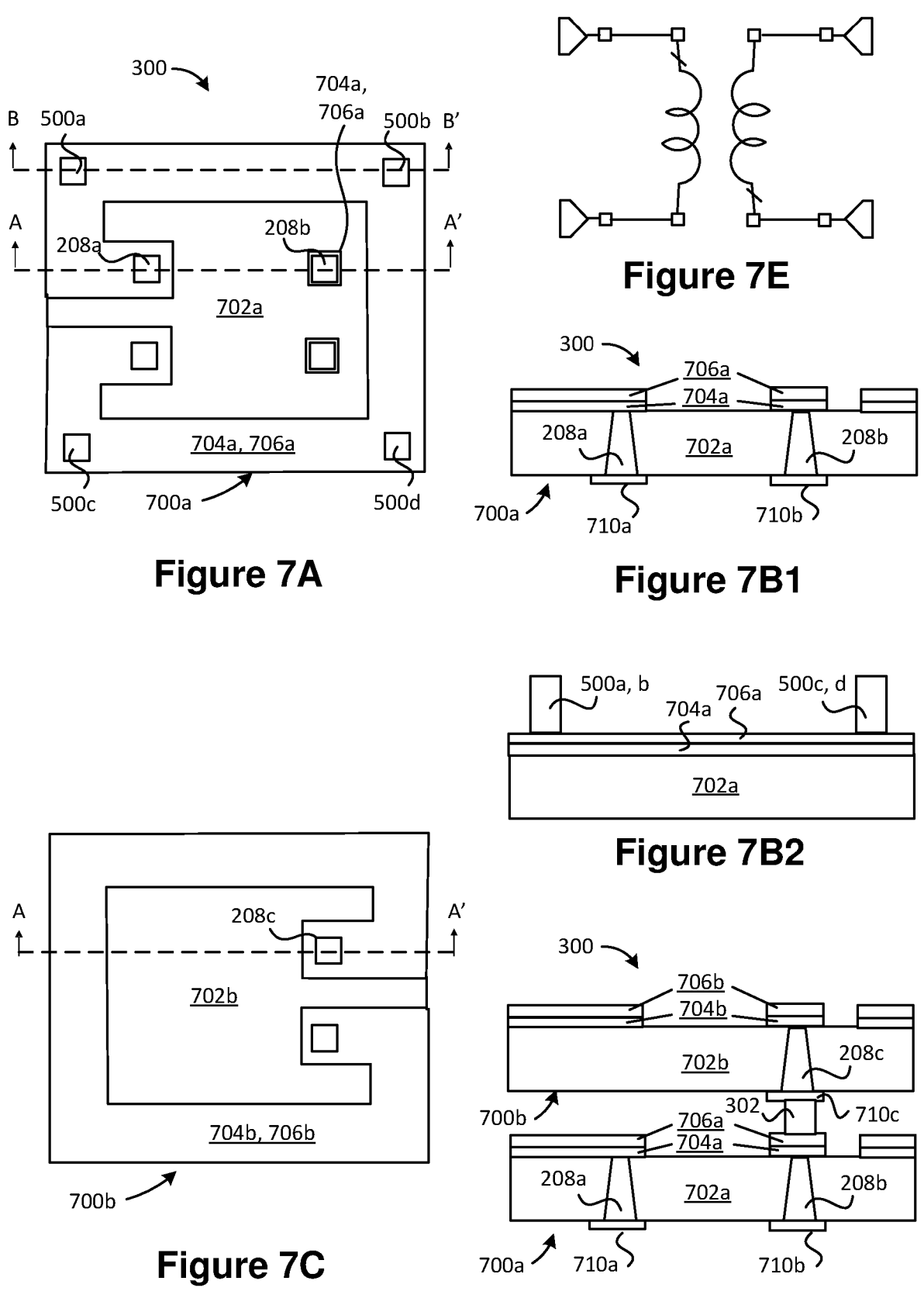
FIG. 7A illustrates a top view of a bottom IPD die in another example device including three stacked IPD dies connected with electrical interconnection structures in accordance with some embodiments of the present disclosure.
FIG. 7C illustrates a top view of the top IPD die of the device of FIG. 7D.
FIG. 7D is a cross-section view of the device 300 of FIG. 7C across line A-A'.
FIG. 7E is an electrical equivalent circuit for the device of FIGS. 7A-7D.

FIG. 7A illustrates a top view of a bottom IPD die 700a in another example device 300 comprising a 1 to 1 coupler with two stacked IPD dies 700a, 700b connected with electrical interconnection structures in accordance with some embodiments of the present disclosure. FIG. 7B1 is a cross-section view of the bottom IPD die 700a of the device 300 of FIG. 7A across line A-A'. FIG. 7B2 is a cross-section view of the bottom IPD die 700a of the device 300 of FIG. 7A across line B-B'. FIG. 7C illustrates a top view of the top IPD die 700b of the device 300. FIG. 7D is a cross-section view of the device 300 of FIG. 7C across line A-A'. FIG. 7E is an electrical equivalent circuit for the device of FIGS. 7A-7D.

As illustrated in this example, the 1 to 1 coupler uses two traces magnetically coupled by stacking one on top of the other. As shown in FIGS. 7A and 7B1, the bottom IPD die 700a includes a metal trace having a second metal 706a on a first metal 704a forming a thicker metal. The top surface of the bottom IPD die 700a includes a first contact comprising metals 704a, 706a and a second contact comprising metals 704a, 706a. First and second bottom metals 710a, 710b of the bottom IPD die 700a are connected through conductive vias 208a, 208d, respectively, to top contacts/metals 704a, 706a of the bottom IPD die 700a. As shown in FIGS. 7A and 7B2, the bottom IPD die 700a also includes four mechanical support structures 500a, 500b, 500c, and 500d that do not have electrical connection. The mechanical support structures 500a, 500b, 500c, and 500d are between the top surface of the bottom IPD die 700a and the bottom surface of the top IPD die 700b.

As illustrated in FIGS. 7C and 7D, the top IPD die 700b includes a metal trace having a second metal 706b on a first metal 704b forming a thicker metal. Bottom metal 710c of the top IPD die 700b is connected through conductive via 208c to top contacts/metals 704a, 706a of the top IPD die 700b. The top surface of the bottom IPD die 700a is connected to a bottom surface of the top IPD die 700b through electrical interconnection structure 302 connected between top contact/metals 704a/706a of the bottom IPD die 700a and bottom metal portion 710c of the top IPD die 700b.

FIG. 8A illustrates a top view of a bottom IPD die 802a in another example device 300 comprising another 1 to 1 coupler with four stacked IPD dies 800a, 800b, 800c, 800d connected with electrical interconnection structures in accordance with some embodiments of the present disclosure. FIG. 8B1 is a cross-section view of the bottom IPD die 800a of the device of FIG. 8A across line A-A'. FIG. 8B2 is a cross-section view of the bottom IPD die 800a of the device of FIG. 8A across line B-B'. FIG. 8C illustrates a top view of the second bottom IPD die 800*b* of the device of FIG. 8A. FIG. 8D is a cross-section view of the device of FIG. 8C across line A-A'. FIG. 8E illustrates a top view of the third bottom IPD die of the device of FIG. 8A. FIG. 8F is a cross-section view of the device of FIG. 8E across line A-A'. FIG. 8G illustrates a top view of the top IPD die of the device of FIG. 8A. FIG. 8H is a cross-section view of the device of FIG. 8G across line A-A'.

As shown in FIGS. 8A and 8B1, the bottom IPD die 800*a* includes a metal trace having a second metal 806*a* on a first metal 804*a* forming a thicker metal. The top surface of the bottom IPD die 800*a* includes a first contact comprising metals 804*a*, 806*a* and a second contact comprising metals 804*a*, 806*a*. First and second bottom metals 810*a*, 810*d* of the bottom IPD die 800*a* are connected through conductive vias 208*a*, 208*b*, respectively, to top contact/metals 804*a*, 806*a* of the bottom IPD die 800*a*. As shown in FIGS. 8A and 8B2, four mechanical support structures 500*a*, 500*b*, 500*c*, and 500*d*, without electrical connection, are between the top surface of the bottom IPD die 800*a* and the bottom surface of the second bottom IPD die 800*b*.

As illustrated in FIGS. 8C and 8D, the second bottom IPD die 800*b* includes a metal trace having a second metal 806*b* on a first metal 804*b* forming a thicker metal. Bottom metal 810*b*, 810*e* of the second bottom IPD die 800*b* is connected through conductive vias 208*c*, 208*e* to top contacts/metals 804*b*, 806*a* of the second bottom IPD die 800*b*. The top surface of the bottom IPD die 800*a* is connected to a bottom surface of the second bottom IPD die 800*b* through two electrical interconnection structures 302*a*, 302*b* connected between top contacts/metals 804*a*/806*a* of the bottom IPD die 800*a* and bottom metal portions 810*b*, 810*e* of the second bottom IPD die 800*b*. As shown in FIG. 8C, four mechanical support structures 500*a*, 500*b*, 500*c*, and 500*d*, without electrical connection, are between the top surface of the second bottom IPD die 800*b* and the bottom surface of the third bottom IPD die 800*c*.

As shown in FIGS. 8E and 8F, the third bottom IPD die 800*c* includes a metal trace having a second metal 806*c* on a first metal 804*c* forming a thicker metal. The top surface of the third bottom IPD die 800*c* includes a first contact comprising metals 804*c*, 806*c* and a second contact comprising metals 804*c*, 806*c*. Bottom metals 810*c*, 810*f* of the third bottom IPD die 800*c* are connected through conductive vias 208*f*, 208*g*, respectively, to top contact/metals 804*c*, 806*c* of the third bottom IPD die 800*c*. The top surface of the second bottom IPD die 800*b* is connected to a bottom surface of the third bottom IPD die 800*c* through two electrical interconnection structures 302*c*, 302*d* connected between top contacts/metals 804*b*/806*b* of the second bottom IPD die 800*b* and bottom metal portions 810*c*, 810*f* of the third bottom IPD die 800*c*. As shown in FIG. 8E, four mechanical support structures 500*a*, 500*b*, 500*c*, and 500*d*, without electrical connection, are between the top surface of the second bottom IPD die 800*b* and the bottom surface of the third bottom IPD die 800*c*.

As illustrated in FIGS. 8G and 8H, the top IPD die 800*d* includes a metal trace having a second metal 806*d* on a first metal 804*d* forming a thicker metal. The top surface of the top IPD die 800*d* includes a contact comprising metals 804*d*, 806*d*. Bottom metal 810*g* of the top IPD die 800*d* is connected through conductive via 208*h* to top contact/metals 804*d*, 806*d* of the top IPD die 800*d*. The top surface of the third bottom IPD die 800*c* is connected to a bottom surface of the top IPD die 800*d* through one electrical interconnection structures 302*e* connected between top contacts/metals 804*cb*/806*c* of the third bottom IPD die 800*c* and bottom metal portion 810*g* of the top IPD die 800*d*. As shown in FIGS. 8G and 8H, four mechanical support structures 500*a*, 500*b*, 500*c*, and 500*d*, without electrical connection, are between the top surface of the third bottom IPD die 800*c* and the bottom surface of the top IPD die 800*d*.

Some embodiments are directed to a device that includes a first IPD die that includes a one to one coupler that includes a first metal trace on the first surface of the first IPD die and a second metal trace on the first surface of the second IPD die; and at least one electrical interconnection structure between one of the first and second surfaces of the first IPD die and one of the third and fourth surfaces of the second IPD die.

Some embodiments are directed to a device that includes a resonant structure that includes a first IPD die includes a MIM capacitor and a second IPD die that includes an inductor; and at least one electrical interconnection structure between one of the first and second surfaces of the first IPD die and one of the third and fourth surfaces of the second IPD die.

Some embodiments further include a dielectric material between a first IDP die and a second IPD die. For example, the dielectric material may be air or some other dielectric material (e.g., with an encapsulant material such as a plastic material that also surrounds and protects the device in a package).

Other embodiments are directed to an RF component package that includes an encapsulated device that includes a plurality of IPD dies in a stacked structure. The first die includes a first SiC substrate. The first IPD die has a first surface on the first SiC substrate and a second surface on the first SiC substrate opposite the first surface and includes a first contact on the first surface and at least one first metal portion on the second surface of the first SiC substrate. The RF component package further includes a second IDP die that includes a second SiC substrate. The second IPD die has a third surface on the second SiC substrate and a fourth surface on the second SiC substrate opposite the third surface and includes a second contact on the third surface and at least one second metal portion on the fourth surface of the second SiC substrate. The RF component package further includes at least one electrical interconnection structure between one of the first and second surfaces of the first IPD die and one of the third and fourth surfaces of the second IPD die.

FIGS. 3-8 are exaggerated views for the purpose of illustration only and are not intended to represent the true scale and structure of actual devices, components, circuits and/or packages.

Figure 9A:
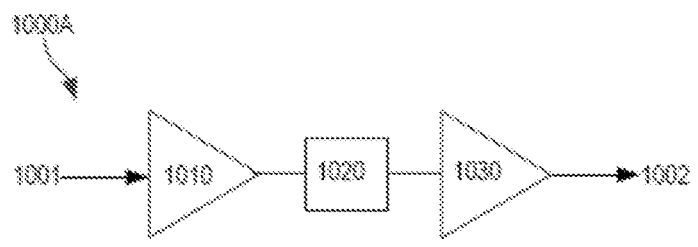
FIGS. 9A-9C are schematic block diagrams of multi-amplifier circuits in which RF transistor amplifiers incorporating transistor devices connected to a device according to embodiments may be used.

Referring to FIG. 9A, an RF transistor amplifier 1000A is schematically illustrated that includes a pre-amplifier 1010 and a main amplifier 1030 that are electrically connected in series. As shown in FIG. 9A, RF transistor amplifier 1000A includes an RF input 1001, the pre-amplifier 1010, an inter-stage impedance matching network 1020, the main amplifier 1030, and an RF output 1002. The inter-stage impedance matching network 1020 may include, for example, a device including an IPD(s) that includes inductors and/or capacitors arranged in any appropriate configuration in order to form a circuit that improves the impedance match between the output of pre-amplifier 1010 and the input of main amplifier 1030.

Figure 9B:
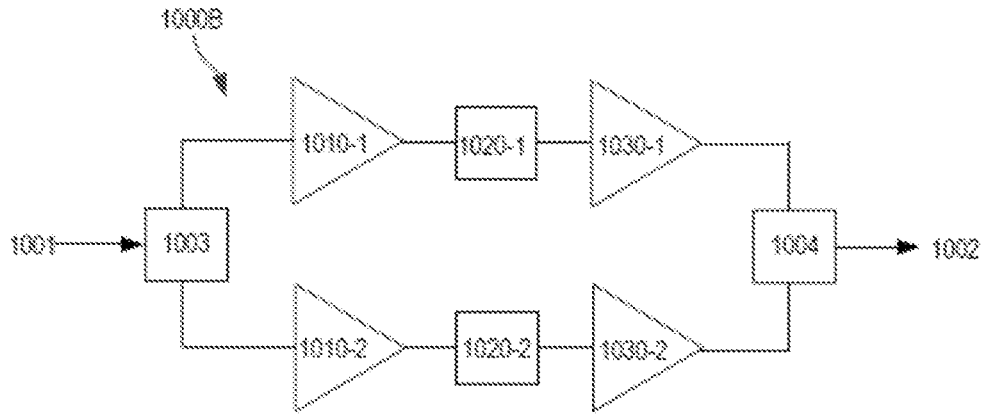

Referring to FIG. 9B, an RF transistor amplifier 1000B is schematically illustrated that includes an RF input 1001, a pair of pre-amplifiers 1010-1, 1010-2, a pair of inter-stage impedance matching networks 1020-1, 1020-2, a pair of main amplifiers 1030-1, 1030-2, and an RF output 1002. A splitter 1003 and a combiner 1004 are also provided. Pre-amplifier 1010-1 and main amplifier 1030-1 (which are electrically connected in series) are arranged electrically in parallel with pre-amplifier 1010-2 and main amplifier 1030-2 (which are electrically connected in series). RF transistor amplifier 1000B may further include a direct wire bond attachment to a device 300 (not shown).

Figure 9C:
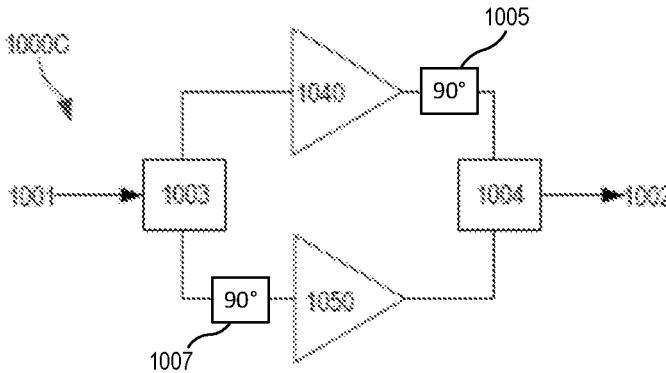

As shown in FIG. 9C, the RF transistor amplifiers according to some embodiments may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 9C, the Doherty RF transistor amplifier 1000C includes an RF input 1001, an input splitter 1003, a main amplifier 1040, a peaking amplifier 1050, an output combiner 1004 and an RF output 1002. The Doherty RF transistor amplifier 1000C includes a 90° transformer 1007 at the input of the peaking amplifier 1050 and a 90° transformer 1005 at the input of the main amplifier 1040, and may optionally include input matching networks and/or an output matching networks (not shown). The inter-stage impedance matching network 1020, splitter 1003, combiner 1004, the main amplifier 1040, and/or the peaking amplifier 1050 may include a direct wire bond attachment to a device 300 (not shown) according to embodiments described herein.

Figure 10:
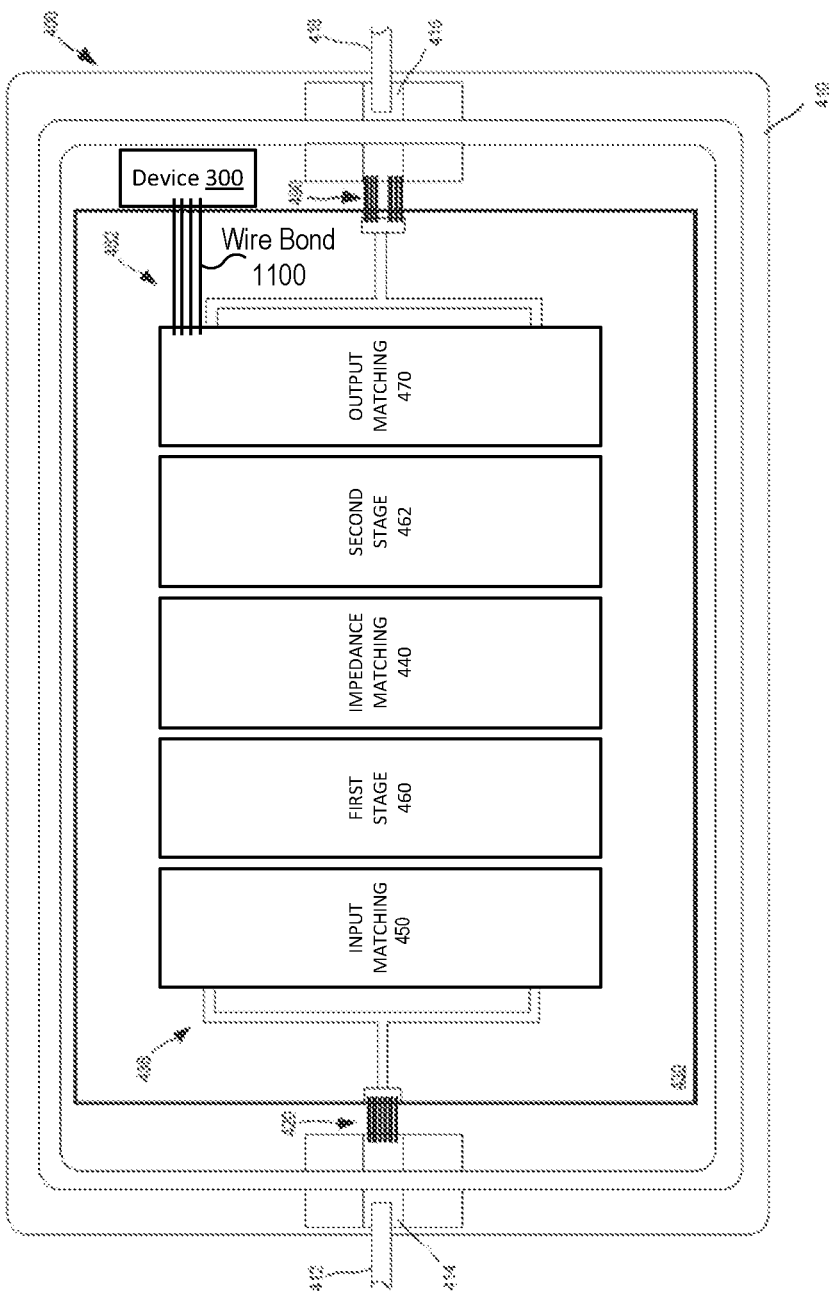
FIG. 10 is a schematic illustration of a plan view of a MMIC amplifier in which a HEMT transistor connected to a device according to embodiments may be used.

FIG. 10 is a schematic illustration of a plan view of a MMIC amplifier in which a HEMT transistor is connected to a device according to embodiments may be used. As shown in FIG. 10, the MMIC RF transistor amplifier 400 includes an integrated circuit chip 430 that is contained within a package 410. The package 410 may comprise a protective housing that surrounds and protects the integrated circuit chip 430. The package 410 may be formed of, for example, a ceramic material.

The package 410 includes an input lead 412 and an output lead 418. The input lead 412 may be mounted to an input lead pad 414 by, for example, soldering. One or more input bond wires 420 may electrically connect the input lead pad 414 to an input bond pad on the integrated circuit chip 430. The integrated circuit chip 430 includes an input feed network 438, an input impedance matching network 450, a first RF transistor amplifier stage 460, an intermediate impedance matching network 440, a second RF transistor amplifier stage 462, an output impedance matching stage 470, and an output feed network 482. The package 410 also includes device 300. A direct wire bond attachment 1100 to device 300 is shown with a first end of wire bonds 1100 attached to device 300 according to embodiments described herein. A second end of wire bonds 1100 are attached to output impedance matching network 470.

The package 410 further includes an output lead 418 that is connected to an output lead pad 416 by, for example, soldering. One or more output bond wires 490 may electrically connect the output lead pad 416 to an output bond pad on the integrated circuit chip 430. The first RF transistor amplifier stage 460 and/or the second RF transistor amplifier stage 462 may be implemented using any of the RF transistor amplifiers according to embodiments of the present disclosure.

The RF transistor amplifiers may be designed to operate in a wide variety of different frequency bands.

Figure 11A:
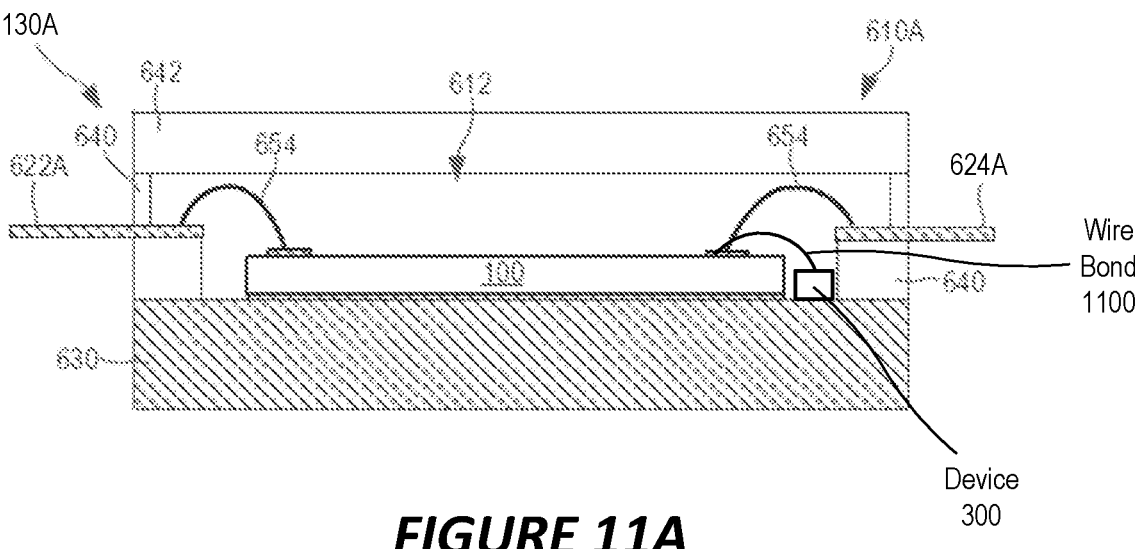
FIGS. 11A and 11B illustrate packaged MMICs including a device according to some embodiments.

FIG. 11A is a schematic side view of a packaged MMIC RF transistor amplifier 130A. As shown in FIG. 11A, packaged RF transistor amplifier 130A includes a MMIC die 100 packaged in an open cavity package 610A. The package 130A includes metal gate leads 622A, metal drain leads 624A, a metal submount 630, sidewalls 640 and a lid 642.

The submount 630 may include materials configured to assist with the thermal management of the package 130A. For example, the submount 630 may include copper and/or molybdenum. In some embodiments, the submount 630 may be composed of multiple layers and/or contain conductive vias/interconnects. In an example embodiment, the submount 630 may be a multilayer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials.

In some embodiments, the sidewalls 640 and/or lid 642 may be formed of, for example, $Al_2O_3$. The lid 642 may be glued to the sidewalls 640 using an epoxy glue. The sidewalls 640 may be attached to the submount 630 conductive via, for example, braising. The gate lead 622A and the drain lead 624A may be configured to extend through the sidewalls 640, though embodiments of the present inventive concepts are not limited thereto.

The MMIC die 100 is mounted on the upper surface of the metal submount 630 in an air-filled cavity 612 defined by the metal submount 630, the ceramic sidewalls 640 and the ceramic lid 642. The gate and drain terminals of MMIC die 100 may be on the top side of the structure, while the source terminal is on the bottom side of the structure.

The gate lead 622A may be connected to the gate terminal of MMIC die 100 by one or more bond wires 654. Similarly, the drain lead 624A may be connected to the drain terminal of MMIC die 100 by one or more bond wires 654. The source terminal may be mounted on the metal submount 630 using, for example, a conductive die attach material (not shown). The metal submount 630 may provide the electrical connection to the source terminal 126 and may also serve as a heat dissipation structure that dissipates heat that is generated in the RF transistor amplifier die 100.

The heat is primarily generated in the upper portion of the MMIC die 100 where relatively high current densities are generated in, for example, the channel regions of the unit cell transistors. This heat may be transferred though the source conductive vias 146 and the semiconductor layer structure of the device to the source terminal and then to the metal submount 630.

A device 300 is mounted on the submount 630 proximate the MMIC die 100. A first end of a wire bond 1100 is attached to device 300, and a second end of the wire bond is attached to the drain of the MMIC die 100.

Figure 11B:
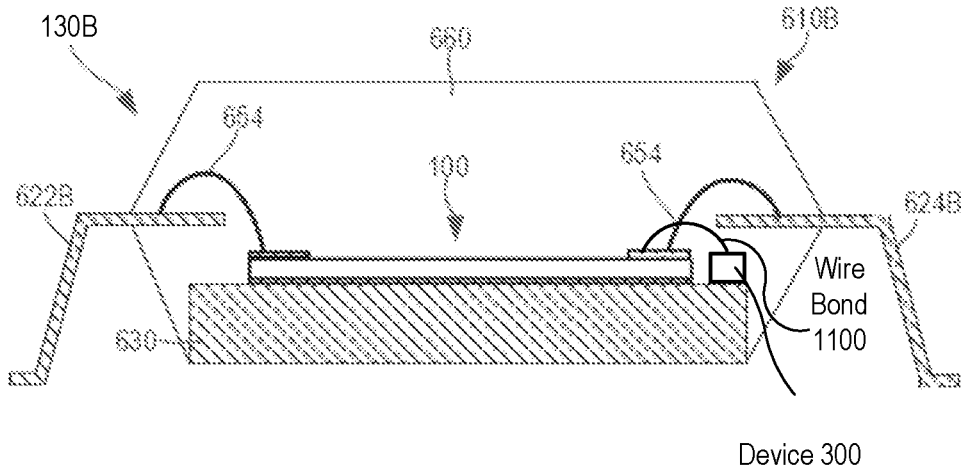

FIG. 11B is a schematic side view of another packaged MMIC RF transistor amplifier 130B. The MMIC transistor amplifier 130B differs from the MMIC RF transistor amplifier 130A in that it includes a different package 610B. The packaged MMIC RF transistor amplifier 130B includes a metal submount 630, as well as metal gate and drain leads 622B, 624B. The packaged MMIC RF transistor amplifier 130B also includes a plastic overmold 660 that at least partially surrounds the RF transistor amplifier die 100, the leads 622B, 624B, and the metal submount 630.

A device 300 is mounted on the submount 630 proximate the MMIC die 100. A first end of a wire bond 1100 is attached to the MIM capacitor 302, and a second end of the wire bond is attached to the drain of the MMIC die 100.

While embodiments discussed above are explained in the non-limiting context of a packaged MMIC RF transistor amplifier that includes a device according to embodiments herein mounted on a submount proximate a MMIC die, the disclosure is not so limited. Instead, other packages may be used, including without limitation, an overmolded package that includes a discrete GaN transistor die and a device that is attached to the GaN transistor die.

Devices as described herein may be used in amplifiers that operate in a wide variety of different frequency bands. In some embodiments, packaged RF transistor amplifiers incorporating transistor devices and devices as described herein may be configured to operate at frequencies greater than 1 GHz. In other embodiments, the RF transistor amplifiers may be configured to operate at frequencies greater than 2.5 GHZ. In still other embodiments, the RF transistor amplifiers may be configured to operate at frequencies greater than 3.1 GHz. In yet additional embodiments, the RF transistor amplifiers may be configured to operate at frequencies greater than 5 GHz. In some embodiments, the RF transistor amplifiers may be configured to operate in at least one of the 2.5-2.7 GHZ, 3.4-4.2 GHZ, 5.1-5.8 GHZ, 12-18 GHZ, 18-27 GHZ, 27-40 GHz or 40-75 GHz frequency bands or sub-portions thereof.

Although embodiments of the inventive concepts have been discussed above with respect to HEMT devices, MMICs, and IPDS, it will be understood that the inventive concepts described herein may be applied to other types of semiconductor devices, such as MOSFETs, DMOS transistors, GaAs CMOS, and/or laterally diffused MOS (LDMOS) transistors.

Packaged RF transistor amplifiers incorporating transistor devices and devices described herein can be used in stand-alone RF transistor amplifiers and/or in multiple RF transistor amplifiers. Examples of how the RF transistor amplifiers according to some embodiments may be used in applications that include multiple amplifiers discussed with reference to FIGS. 9A-9C.

The RF transistor amplifiers according to embodiments may be formed as discrete devices, or may be formed as part of a MMIC or an IPD.

A transistor device including a device according to some embodiments may be utilized in power semiconductor devices and/or applications. In some embodiments, the power semiconductor devices may be utilized for a power module that may include structure optimized for state-of-the-art wide band gap power semiconductor devices such as GaN or other Group III-nitride materials, SiC, and the like, which are capable of carrying high amounts of currents and voltages and switching at increasingly faster speeds in comparison with established technologies. The power devices may include Wide Band Gap (WBG) semiconductors, including GaN, SiC, and the like, and offer numerous advantages over conventional Silicon (Si) as a material for the power devices.

A transistor device including a device according to some embodiments may be utilized in RF applications. In particular, a transistor device and device according to some embodiments may be utilized in wireless base stations that connect to a wireless device. In further aspects, the transistor device and device may be utilized in in wireless communication devices.

Although embodiments of the inventive concepts have been described in considerable detail with reference to certain configurations thereof, other versions are possible. The device can also have many different shapes. Accordingly, the spirit and scope of the invention should not be limited to the specific embodiments described above.

What is claimed is:

1. A device comprising:
   a first integrated passive device (IPD) die comprising at least one passive component fabricated on a first silicon carbide (SiC) substrate, the first IPD die having a first surface on the first SiC substrate and a second surface on the first SiC substrate opposite the first surface and comprising a first contact on the first surface and at least one first metal portion on the second surface of the first SiC substrate;
   a second IPD die comprising at least one passive component fabricated on a second SiC substrate, the second IPD die having a third surface on the second SiC substrate and a fourth surface on the second SiC substrate opposite the third surface and comprising a second contact on the third surface and at least one second metal portion on the fourth surface of the second SiC substrate; and
   at least one electrical interconnection structure between one of the first and second surfaces of the first IPD die and one of the third and fourth surfaces of the second IPD die.

2. The device of claim 1, further comprising:
   at least one mechanical support structure between one of the first and second surfaces of the first IPD die and one of the third and fourth surfaces of the second IPD die.

3. The device of claim 1, wherein the at least one electrical interconnection structure comprises at least one of (i) a metal material comprising copper (Cu), gold (Ag), or silver tin (AgSn); and (ii) a conductive epoxy.

4. The device of claim 1, wherein the first surface of the first IPD die faces the fourth surface of the second IPD die and the at least one electrical interconnection structure is connected to the first contact of the first IPD die and the at least one second metal portion on the fourth surface of the second IPD die.

5. The device of claim 1, wherein the first surface of the first IPD die faces the third surface of the second IPD die and the at least one electrical interconnection structure is connected to the first contact of the first IPD die and the second contact on the third surface of the second IPD die.

6. The device of claim 1, further comprising:
   a first conductive via structure in the first SiC substrate, wherein the at least one first metal portion on the second surface of the first SiC substrate is electrically connected to the first contact on the first surface of the first IPD die by the first conductive via structure; and
   a second conductive via structure in the second SiC substrate, wherein the at least one second metal portion on the fourth surface of the second SiC substrate is electrically connected to the second contact on the third surface of the second IPD die by the second conductive via structure.

7. The device of claim 1, wherein the at least one first metal portion on the second surface of the first SiC substrate is patterned to form at least one of a pad and a routing trace for the electrical connection of the first IDP die to the second IPD die.

8. The device of claim 1, wherein the at least one second metal portion on the fourth surface of the second SiC substrate is patterned to form at least one of a pad and a routing trace for the electrical connection of the first IDP die to the second IPD die.

9. The device of claim 1, further comprising:
a dielectric material between the first IDP die and the second IPD die.

10. The device of claim 1, wherein the first IPD die comprises a first metal-insulator-metal, MIM, capacitor on the first SiC substrate and the second IPD die comprises a second MIM capacitor on the second SiC substrate and the at least one electrical interconnection structure comprises (i) a first electrical interconnection structure between a first metal on the first surface of the first MIM capacitor to a second metal on the third surface of the second MIM capacitor and (ii) a second electrical interconnection structure between a second metal on the first surface of the first MIM capacitor to a first metal on the third surface of the second MIM capacitor.

11. The device of claim 1, wherein the first IPD die comprises a first metal-insulator-metal (MIM) capacitor on the first SiC substrate and the second IPD die comprises a second MIM capacitor on the second SiC substrate and the at least one electrical interconnection structure comprises (i) a first electrical interconnection structure between a first metal on the first surface of the first MIM capacitor to a first metal portion of the at least one second metal portion on the fourth surface of the second IPD die and (ii) a second electrical interconnection structure between a second metal on the first surface of the first MIM capacitor and a second metal portion of the at least one second metal portion on the fourth surface of the second IPD die.

12. The device of claim 1, wherein the first IPD die comprises a first spiral inductor and the second IPD die comprises a second spiral inductor and the at least one electrical interconnection structure comprises a first electrical interconnection structure and a second electrical interconnection structure between the first and second spiral inductors connected in parallel.

13. The device of claim 1, wherein the first IPD die comprises a first spiral inductor and the second IPD die comprises a second spiral inductor and the at least one electrical interconnection structure between the first and second spiral inductors connected in series.

14. The device of claim 1, wherein the first IPD die comprises a one to one coupler comprising a first metal trace on the first surface of the first IPD die and a second metal trace on the first surface of the second IPD die, and the at least one electrical interconnection structure is between one of the first and second surfaces of the first IPD die and one of the third and fourth surfaces of the second IPD die.

15. The device of claim 1, wherein the device comprises a resonant structure comprising the first IPD die comprising a metal-insulator-metal capacitor and the second IPD die comprising an inductor, and the at least one electrical interconnection structure is between one of the first and second surfaces of the first IPD die and one of the third and fourth surfaces of the second IPD die.

16. An RF component package, comprising:
an encapsulated device comprising a plurality of IPD dies in a stacked structure, wherein the device comprises:
a first IDP die comprising at least one passive component fabricated on a first silicon carbide (SiC) substrate, the first IPD die having a first surface on the first SiC substrate and a second surface on the first SiC substrate opposite the first surface and comprising a first contact on the first surface and at least one first metal portion on the second surface of the first SiC substrate;
a second IDP die comprising at least one passive component fabricated on a second SiC substrate, the second IPD die having a third surface on the second SiC substrate and a fourth surface on the second SiC substrate opposite the third surface and comprising a second contact on the third surface and at least one second metal portion on the fourth surface of the second SiC substrate; and
at least one electrical interconnection structure between one of the first and second surfaces of the first IPD die and one of the third and fourth surfaces of the second IPD die.

17. The RF component package of claim 16, further comprising:
at least one mechanical support structure between one of the first and second surfaces of the first IPD die and one of the third and fourth surfaces of the second IPD die.

18. The RF component package of claim 16, wherein the at least one electrical interconnection structure comprises at least one of (i) a metal material comprising copper (Cu), gold (Ag), or silver tin (AgSn); and (ii) a conductive epoxy.

19. The RF component package of claim 16, wherein the first surface of the first IPD die faces the fourth surface of the second IPD die and the at least one electrical interconnection structure is connected to the first contact of the first IPD die and the at least one second metal portion on the fourth surface of the second IPD die.

20. The RF component package of claim 16, wherein the first surface of the first IPD die faces the third surface of the second IPD die and the at least one electrical interconnection structure is connected to the first contact of the first IPD die and the second contact on the third surface of the second IPD die.

21. The RF component package of claim 16, further comprising:
a first conductive via structure in the first SiC substrate, wherein the at least one first metal portion on the second surface of the first SiC substrate is electrically connected to the first contact on the first surface of the first IPD die by the first conductive via structure; and
a second conductive via structure in the second SiC substrate, wherein the at least one second metal portion on the fourth surface of the second SiC substrate is electrically connected to the second contact on the third surface of the second IPD die by the second conductive via structure.

22. The RF component package of claim 16, wherein the at least one first metal portion on the second surface of the first SiC substrate is patterned to form at least one of a pad and a routing trace for the electrical connection of the first IDP die to the second IPD die.

23. The RF component package of claim 16, wherein the at least one second metal portion on the fourth surface of the second SiC substrate is patterned to form at least one of a pad and a routing trace for the electrical connection of the first IDP die to the second IPD die.

24. The RF component package of claim 16, further comprising:

a dielectric material between the first IDP die and the second IPD die.

25. The RF component package of claim 16, wherein the first IPD die comprises a first metal-insulator-metal (MIM) capacitor on the first SiC substrate and the second IPD die comprises a second MIM capacitor on the second SiC substrate and the at least one electrical interconnection structure comprises (i) a first electrical interconnection structure between a first metal on the first surface of the first MIM capacitor and a second metal on the third surface of the second MIM capacitor and (ii) a second electrical interconnection structure between a second metal on the first surface of the first MIM capacitor and a first metal on the third surface of the second MIM capacitor.

26. The RF component package of claim 16, wherein the first IPD die comprises a first metal-insulator-metal (MIM) capacitor on the first SiC substrate and the second IPD die comprises a second MIM capacitor on the second SiC substrate and the at least one electrical interconnection structure comprises (i) a first interconnection structure between a first metal on the first surface of the first MIM capacitor and a first metal portion of the at least one second metal portion on the fourth surface of the second IPD die and (ii) a second electrical interconnection structure between a second metal on the first surface of the first MIM capacitor and second metal portion of the at least one second metal portion on the fourth surface of the second IPD die.

27. The RF component package of claim 16, wherein the first IPD die comprises a first spiral inductor and the second IPD die comprises a second spiral inductor and the at least one electrical interconnection structure comprises a first electrical interconnection structure and a second electrical interconnection structure between the first and second spiral inductors connected in parallel.

28. The RF component package of claim 16, wherein the first IPD die comprises a first spiral inductor and the second IPD die comprises a second spiral inductor and the at least one electrical interconnection structure is between the first and second spiral inductors connected in series.

29. The RF component package of claim 16, wherein the first IPD die comprises a one to one coupler comprising a first metal trace of the first surface of the first IPD die and a second metal trace on the third surface of the second IPD die, and the at least one electrical interconnection structure is between one of the first and second surfaces of the first IPD die and one of the third and fourth surfaces of the second IPD die.

30. The RF component package of claim 16, wherein the device comprises a resonant structure comprising the first IPD die comprising a metal-insulator-metal capacitor and the second IPD die comprising an inductor, and the at least one electrical interconnection structure is between one of the first and second surfaces of the first IPD die and one of the third and fourth surfaces of the second IPD die.

\* \* \* \* \*